(12) United States Patent
Kajigaya

(10) Patent No.: US 10,776,016 B2
(45) Date of Patent: Sep. 15, 2020

(54) DATA CACHING FOR FERROELECTRIC MEMORY

(71) Applicant: Micron Technology, Inc., Boise, ID (US)

(72) Inventor: Kazuhiko Kajigaya, Saitama (JP)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 16/122,526

(22) Filed: Sep. 5, 2018

(65) Prior Publication Data

US 2019/0004713 A1 Jan. 3, 2019

Related U.S. Application Data

(63) Continuation of application No. 15/140,073, filed on Apr. 27, 2016, now Pat. No. 10,082,964.

(51) Int. Cl.

| G06F 3/06 | (2006.01) |
|---|---|
| G11C 11/22 | (2006.01) |
| G06F 12/0806 | (2016.01) |
| G11C 7/06 | (2006.01) |
| G11C 7/12 | (2006.01) |

(Continued)

(52) U.S. Cl.
CPC .......... *G06F 3/0616* (2013.01); *G06F 3/0656* (2013.01); *G06F 3/0659* (2013.01); *G06F 3/0683* (2013.01); *G06F 12/0806* (2013.01); *G11C 7/065* (2013.01); *G11C 7/12* (2013.01); *G11C 11/22* (2013.01); *G11C 11/223* (2013.01); *G11C 11/2253* (2013.01); *G11C 11/2273* (2013.01); *G11C 11/2275* (2013.01); *G06F 2212/1036* (2013.01); *G06F 2212/62* (2013.01); *G11C 7/18* (2013.01); *G11C 8/12* (2013.01)

(58) Field of Classification Search
None
See application file for complete search history.

(56) References Cited

U.S. PATENT DOCUMENTS

| 5,270,967 A | 12/1993 | Moazzami et al. |
|---|---|---|
| 6,370,058 B1 | 4/2002 | Fukumoto |

(Continued)

FOREIGN PATENT DOCUMENTS

| CN | 1317798 A | 10/2001 |
|---|---|---|
| CN | 1404069 | 3/2003 |

(Continued)

OTHER PUBLICATIONS

ISA/KR, International Search Report and Written Opinion of the International Search Authority, Int'l. Appl. No. PCT/US2017/029420, dated Jul. 24, 2017, Korean Intellectual Property Office, Seo-gu, Daejeon, Republic of Korea, 14 pgs.

(Continued)

*Primary Examiner* — Kevin Verbrugge
(74) *Attorney, Agent, or Firm* — Holland & Hart LLP

(57) ABSTRACT

Methods, systems, and devices for operating a memory device are described. One method includes caching data of a memory cell at a sense amplifier of a row buffer upon performing a first read of the memory cell; determining to perform at least a second read of the memory cell after performing the first read of the memory cell; and reading the data of the memory cell from the sense amplifier for at least the second read of the memory cell.

20 Claims, 19 Drawing Sheets

(51) Int. Cl.
*G11C 7/18* (2006.01)
*G11C 8/12* (2006.01)

(56) References Cited

U.S. PATENT DOCUMENTS

| | | | |
|---|---|---|---|
| 6,873,536 | B2 | 3/2005 | Komatsuzaki |
| 7,239,557 | B2 | 7/2007 | Ha |
| 7,843,725 | B2 | 11/2010 | Sarin et al. |
| 8,023,334 | B2 | 9/2011 | Hoei et al. |
| 8,375,273 | B2 | 2/2013 | Hara |
| 8,996,782 | B2 | 3/2015 | Ide et al. |
| 9,432,298 | B1 * | 8/2016 | Smith ............... H04L 49/9057 |
| 2001/0024396 | A1 | 9/2001 | Bohm et al. |
| 2003/0058681 | A1 | 3/2003 | Coulson |
| 2005/0111275 | A1 | 5/2005 | Kiehl |
| 2007/0041257 | A1 | 2/2007 | Kim |
| 2007/0156947 | A1 | 7/2007 | Vaithiananthan et al. |
| 2009/0147596 | A1 | 6/2009 | Shiah |
| 2009/0248955 | A1 | 10/2009 | Tamada |
| 2011/0141836 | A1 | 6/2011 | Luthra et al. |

FOREIGN PATENT DOCUMENTS

| | | |
|---|---|---|
| CN | 1574073 A | 2/2005 |
| CN | 1992077 A | 7/2007 |
| CN | 103531235 A | 1/2014 |
| CN | 101329901 A | 12/2018 |
| JP | H07211062 A | 8/1995 |
| JP | 2001210073 A | 8/2001 |
| JP | 2007512657 A | 5/2007 |
| JP | 2016506009 A | 2/2016 |
| JP | 2016147802 A | 8/2016 |

OTHER PUBLICATIONS

Jeong et al., "Balancing DRAM Locality and Parallelism in Shared Memory CMP Systems", 2012 IEEE HPCA; pp. 1-12.
Liu et al., "A Software Memory Partition Approach for Eliminating Bank-level Interference in Multicore Systems", Pact '12; 9 pages, 2012.
O et al., "Row-Buffer Decoupling: A Case for Low-Latency DRAM Microarchitecture", IEEE 2014; 12 pages.
Qureshi et al., "Enhancing Lifetime and Security of PCM-Based Main Memory with Start-Gap Wear Leveling", IBM Research Micro 2009; pp. 14-23.
China National Intellectual Property Administration, "Office Action," issued in connection with Chinese Patent Application No. 2011780026279.2, dated Nov. 4, 2019 (8 pages).
Choi et al., "A 0.25-/spl mu/m 3.0-V 1T1C 32-Mb nonvolatile ferroelectric RAM With Address Transition Detector and Current Forcing Latch Sense Amplifier Scheme," IEEE Journal of Solid-State Circuits, vol. 37, No. 11, Nov. 2002 (7 pages).
European Patent Office, "European Search Report," issued in connection with European Application No. 17790270.7, dated Nov. 27, 2019 (10 pages).
Japanese Patent Office, "Notice of Rejection Ground," issued in connection with Japanese Patent Application No. 2018-555917, dated Jan. 28, 2020 (13 pages).

* cited by examiner

DATA CACHING FOR FERROELECTRIC MEMORY

CROSS REFERENCE

The present Application for Patent is a continuation of U.S. patent application Ser. No. 15/140,073 by Kajigaya, entitled "Data Caching for Ferroelectric Memory," filed Apr. 27, 2016, now U.S. Pat. No. 10,082,964, assigned to the assignee hereof, and is expressly incorporated by reference in its entirety herein.

BACKGROUND

The following relates generally to memory devices, and more specifically to data caching.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), FeRAM, phase-change RAM (PCRAM), spin-transfer torque RAM (STT-RAM), resistive RAM (ReRAM), magnetic RAM (MRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain embodiments of volatile memory may offer performance advantages, such as faster read or write speeds, while aspects of non-volatile memory, such as the ability to store data without periodic refreshing, may be advantageous.

In some cases, a FeRAM may be operated at a speed and with a nonvolatile property similar to that of a DRAM. In these cases, however, the ferroelectric capacitors used in the memory cells of the FeRAM may suffer from fatigue as a result of repeated polarizations and inversions of the ferroelectric materials within the ferroelectric capacitors, resulting in a reduction of residual polarization. Also, when writing operations are continuously carried out in the same polarization direction, a shift in the hysteresis characteristic of a memory cell, referred to as an "in-print," may cause subsequent degradation in the rewriting characteristic of the memory cell. Compared to a DRAM, a FeRAM may therefore support fewer read-out and writing operations over its lifetime.

BRIEF DESCRIPTION OF THE DRAWINGS

Embodiments of the disclosure are described with reference to the following figures.

DETAILED DESCRIPTION

Figure 1:
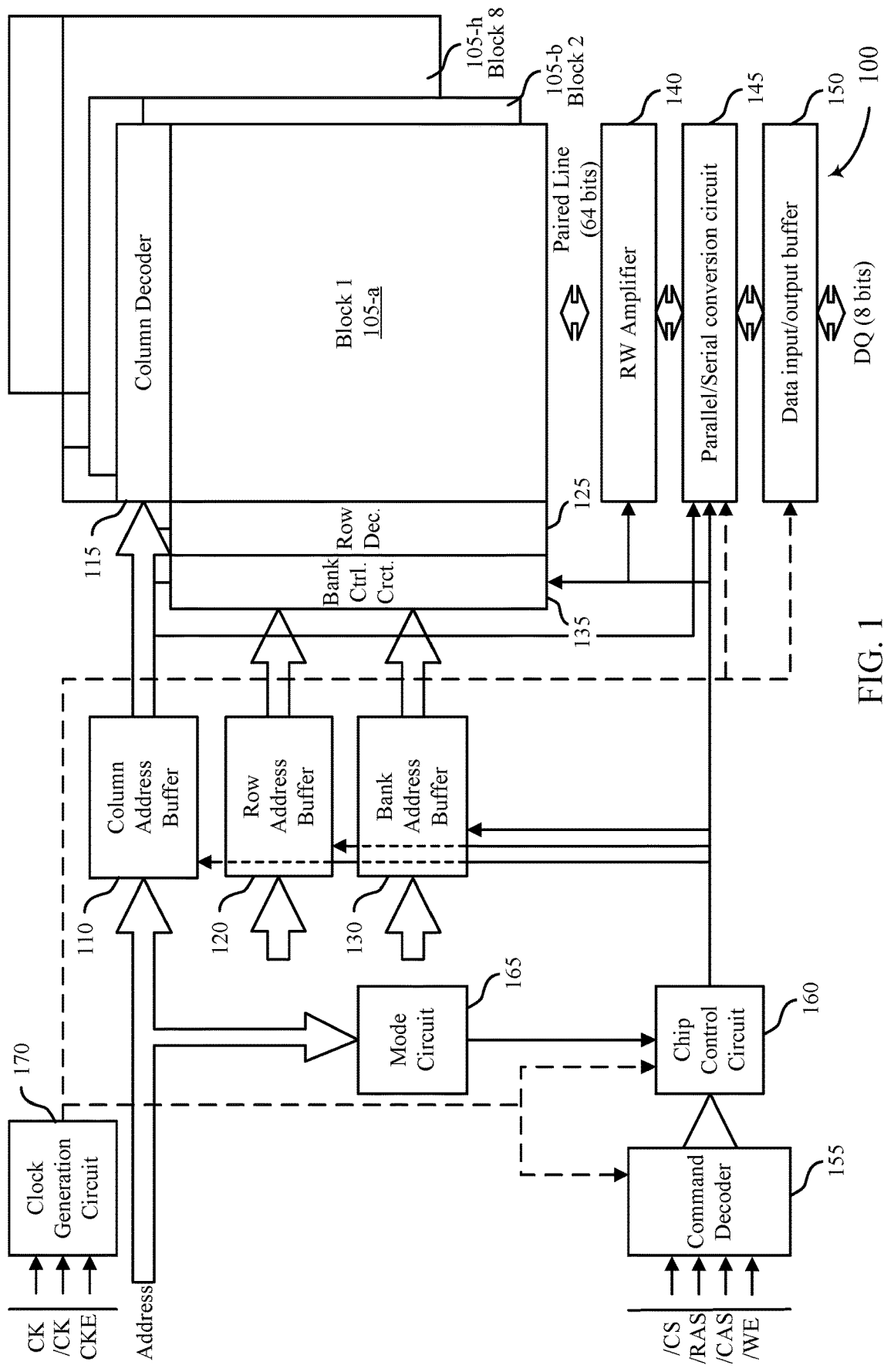
FIG. 1 illustrates an example memory device, in accordance with various embodiments of the present disclosure.

The disclosed techniques relate to a memory device having a plurality of memory cells (e.g., ferroelectric memory cells, such as Fe-RAM or hybrid RAM (HRAM) cells). Ferroelectric memory cells have an information storage capacitor having a ferroelectric film. Over time, the ferroelectric film may deteriorate and performance of the ferroelectric memory cell may degrade. In one embodiment of the techniques described herein, data of a memory cell may be cached at a sense amplifier of a row buffer upon performing a first read of the memory cell. Upon determining to perform at least a second read of the memory cell, after the first read of the memory cell, the data of the memory cell may be read from the sense amplifier instead of the memory cell. In this manner, fewer direct reads of the memory cell may be performed, and the lifetime of the memory cell may be extended. Power consumption may also be reduced by caching data in sense amplifiers. By caching data for multiple banks of a memory device in respective row buffers, the memory device can be operated as a sort of multi-page cache. When storing new data to a memory cell, the new data may be written to a sense amplifier, and then to a memory cell. Subsequently, the new data may be read from the sense amplifier without having to load the new data from the memory cell to the sense amplifier (i.e., because the new data is already cached in the sense amplifier). Again, the number of direct reads of the memory cell is reduced, the lifetime of the memory cell may be extended, and power consumption may be reduced. Command bus efficiency may also be improved, because a load command does not need to be issued before reading the new data from the memory cell.

In another embodiment of the techniques described herein, processes of a multicore processor may be mapped to different groups of memory banks in a memory device, in which each memory bank is associated with a row buffer. A plurality of memory cells associated with a memory address in a memory bank may then be addressed, to retrieve a data word. The plurality of memory cells may be addressed upon receiving a first memory read request associated with the memory address from a process of the plurality of processes. Upon receiving, from the process, a second memory read request associated with the memory address, the row buffer associated with the memory bank may be addressed to retrieve the data word. The mapping of processes to different groups of memory banks may tend to increase the hit rate within the row buffers of the memory device, which may reduce the number of direct reads of memory cells, increase the lifetimes of the memory cells, and reduce power consumption by a memory device.

Embodiments of the disclosure introduced above are further described below in the context of a memory device. Specific examples of a hybrid memory are then described. These and other embodiments of the disclosure are further illustrated by and described with reference to apparatus diagrams, system diagrams, and flowcharts that relate to the configuration, operation, and use of a hybrid memory.

FIG. 1 illustrates an example memory device 100, in accordance with various embodiments of the present disclosure. The memory device 100 may include a plurality of memory cells arranged in a plurality of memory blocks (e.g., eight memory blocks including a first memory block 105-a, a second memory block 105-b, and an eighth memory block 105-h). The memory cells may be addressed by an address including a column address, a row address, and a bank address. The column address may be received by a column address buffer 110 and applied to a column decoder 115 and a parallel/serial conversion circuit 145. The row address may be received by a row address buffer 120 and applied to a bank control circuit 135, which bank control circuit 135 may, in turn, provide the row address to a row decoder 125. The bank address may be received by a bank address buffer 130 and applied to a bank control circuit 135.

Data read from a subset of the memory cells may be amplified at a read/write (RW) amplifier 140, converted to a serial data stream by the parallel/serial conversion circuit 145, and temporarily stored in a data input/output buffer 150. Data written to a subset of the memory cells may be temporarily stored in the data input/output buffer 150, converted to a parallel data stream by the parallel/serial conversion circuit 145, and amplified at the RW amplifier 140 before being written to the subset of the memory cells.

A read command or write command may be received and decoded by a command decoder 155. Decoded commands may be provided from the command decoder 155 to a chip control circuit 160, and a mode signal may be provided from a mode circuit 165 to the chip control circuit 160. The chip control circuit 160 may provide signals to control the column address buffer 110, the row address buffer 120, the bank address buffer 130, the bank control circuit 135, the RW amplifier 140, and the parallel/serial conversion circuit 145. A clock generation circuit 170 may provide one or more clock signals to the parallel/serial conversion circuit 145, the data input/output buffer 150, the command decoder 155, and the chip control circuit 160.

A memory controller may control the operation of memory cells in the memory device 100 through the various components of the memory device 100. For example, a memory controller may generate column, row, and bank address signals in order to activate desired word lines and digit lines of the memory blocks 105, to access memory cells of the memory blocks 105. The memory controller may also generate and control various voltage potentials used during the operation of the memory device 100. In general, the amplitude, shape, or duration of an applied voltage discussed herein may be adjusted or varied and may be different for the various operations discussed in operating the memory device 100.

Figure 2:
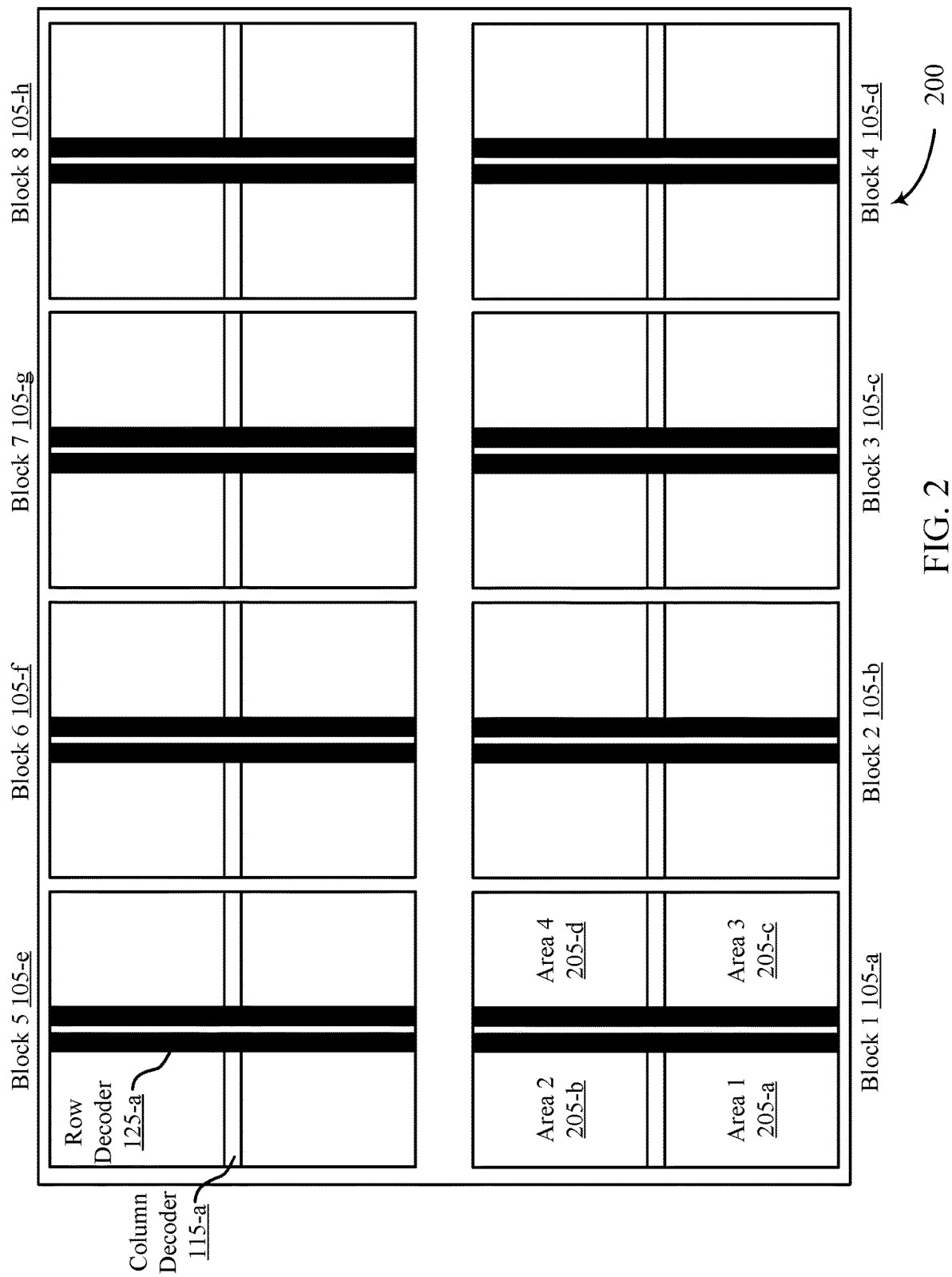
FIG. 2 illustrates an example architecture of memory blocks and memory areas of a memory device, such as the memory device, in accordance with various embodiments of the present disclosure.

FIG. 2 illustrates an example architecture 200 of memory blocks 105 and memory areas 205 of a memory device, such as the memory device 100, in accordance with various embodiments of the present disclosure. Each block 105 and each memory area 205 may include a plurality of memory cells. In some examples, the blocks 105 may include eight blocks (e.g., a first memory block 105-*a*, a second memory block 105-*b*, a third memory block 105-*c*, a fourth memory block 105-*d*, a fifth memory block 105-*e*, a sixth memory block 105-*f*, a seventh memory block 105-*g*, and an eighth memory block 105-*h*).

Each of the memory blocks 105 shown in FIG. 2 may be subdivided into a plurality of memory areas 205. For example, the first memory block 105-*a* may be subdivided into a first memory area 205-*a*, a second memory area 205-*b*, a third memory area 205-*c*, and a fourth memory area 205-*d*. In some examples, each memory block 105 may cover a rectangular area of a memory chip, with column decoders 115-*a* implemented along a first dimension of each memory block 105 (e.g., a horizontal dimension), and row decoders 125-*a* implemented along a second dimension of each memory block (e.g., along a vertical dimension).

Figure 3:
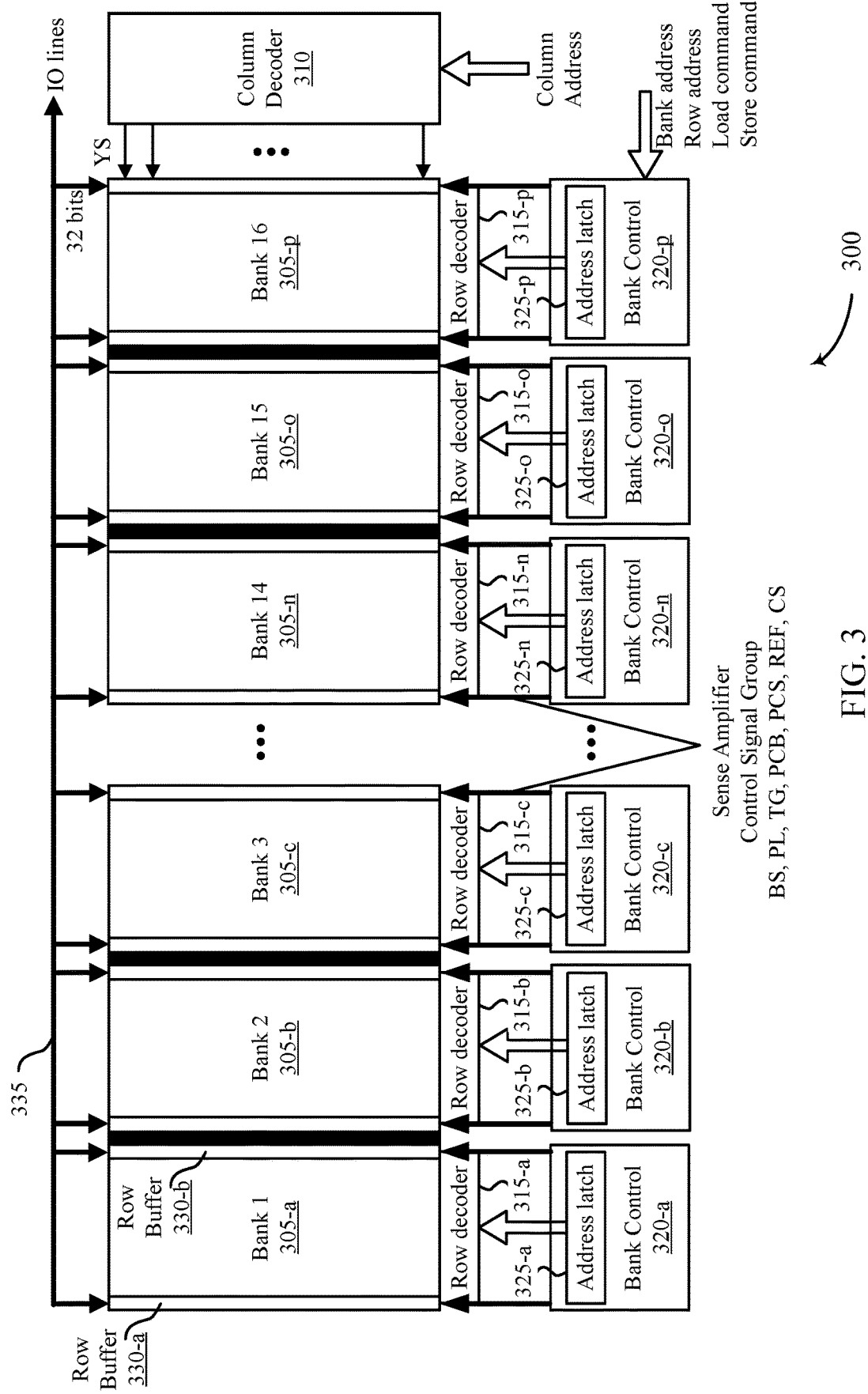
FIG. 3 illustrates an example architecture of a memory area of a memory block, such as the memory area of the memory block, in accordance with various embodiments of the present disclosure.

FIG. 3 illustrates an example architecture 300 of a memory area of a memory block, such as the memory area 205-*a* of the memory block 105-*a*, in accordance with various embodiments of the present disclosure. The memory area 205-*a* may include a plurality of memory banks 305 (e.g., sixteen memory banks, including a first memory bank 305-*a*, a second memory bank 305-*b*, a third memory bank 305-*c*, a fourteenth memory bank 305-*n*, a fifteenth memory bank 305-*o*, and a sixteenth memory bank 305-*p*).

As shown in FIG. 3, memory cells within the memory banks 305 may be addressed by a column decoder 310, a plurality of per-memory bank row decoders 315 (e.g., a first row decoder 315-*a*, a second row decoder 315-*b*, a third row decoder 315-*c*, a fourteenth row decoder 315-*n*, a fifteenth row decoder 315-*o*, and a sixteenth row decoder 315-*p*), and a plurality of per-memory bank control circuits 320 (e.g., a first bank control circuit 320-*a*, a second bank control circuit 320-*b*, a third bank control circuit 320-*c*, a fourteenth bank control circuit 320-*n*, a fifteenth bank control circuit 320-*o*, and a sixteenth bank control circuit 320-*p*). In some examples, a column address may be provided to the column decoder, and a bank address, row address, and load command or store command may be provided to each bank control circuit 320. Each bank control circuit 320 may latch the row address in an associated address latch 325 (e.g., a first address latch 325-*a*, a second address latch 325-*b*, a third address latch 325-*c*, a fourteenth address latch 325-*n*, a fifteenth address latch 325-*o*, or a sixteenth address latch 325-*p*)) and pass the row address to a corresponding row decoder 315.

Upon addressing a memory bank 305 during a load command, a plurality of sense amplifiers in a row buffer 330 associated with the memory bank 305 (e.g., a plurality of sense amplifiers in the row buffer 330-*a*/330-*b* associated with the first memory bank 305-*a*) may receive data from a plurality of memory cells, amplify the data, and latch the data for read-out on the IO lines 335. Upon addressing a memory bank 305 during a store command, data on the IO lines 335 may be amplified by the sense amplifiers in a row buffer 330 and stored in a plurality of memory cells.

Each bank control circuit 320 may provide a number of control signals to the sense amplifiers of a row buffer 330. In some examples, the control signals may include a bank select (BS) signal, a plate voltage (PL), an isolation gate control signal (TG), a bit line pre-charge signal (PCB), a sense amplifier pre-charge signal (PCS), a reference voltage application signal (REF), or a sense circuit activation signal (CS). Example uses of these signals when loading or storing data within a memory bank is described with reference to FIGS. 9-14, 16, and 17.

Figure 4:
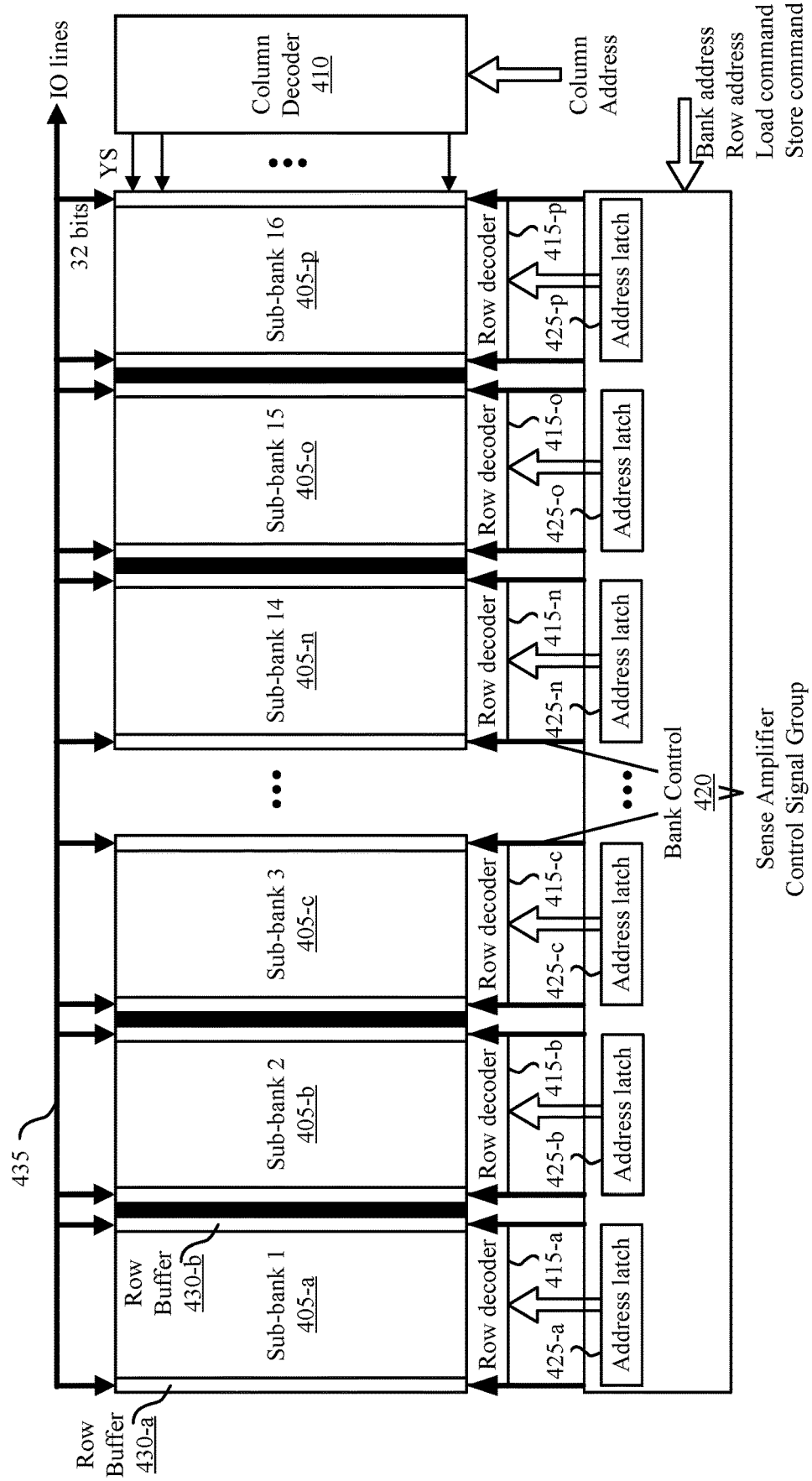
FIG. 4 illustrates an example architecture of a memory area of a memory block, such as the memory area of the memory block, in accordance with various embodiments of the present disclosure.

FIG. 4 illustrates an example architecture 400 of a memory area of a memory block, such as the memory area 205-*a* of the memory block 105-*a*, in accordance with various embodiments of the present disclosure. The memory area 205-*a* may include a plurality of memory sub-banks 405 (e.g., sixteen memory sub-banks, including a first memory sub-bank 405-*a*, a second memory sub-bank 405-*b*, a third memory sub-bank 405-*c*, a fourteenth memory sub-bank 405-*n*, a fifteenth memory sub-bank 405-*o*, and a sixteenth memory sub-bank 405-*p*).

As shown in FIG. 4, memory cells within the memory sub-banks 405 may be addressed by a column decoder 410, a plurality of per-memory bank row decoders 415 (e.g., a first row decoder 415-*a*, a second row decoder 415-*b*, a third row decoder 415-*c*, a fourteenth row decoder 415-*n*, a fifteenth row decoder 415-*o*, and a sixteenth row decoder 415-*p*), and a bank control circuit 420. In some examples, a column address may be provided to the column decoder 410, and a bank address, row address, and load command or store command may be provided to the bank control circuit 420. The bank control circuit 420 may latch the row address in one of a per memory sub-bank address latch 425 (e.g., a first address latch 425-*a*, a second address latch 425-*b*, a third address latch 425-*c*, a fourteenth address latch 425-*n*, a fifteenth address latch 425-*o*, or a sixteenth address latch 425-*p*)) and pass the row address to a corresponding row decoder 415.

Upon addressing a memory sub-bank 405 during a load command, a plurality of sense amplifiers in a row buffer 430 associated with the memory sub-bank 405 (e.g., a plurality of sense amplifiers in the row buffer 430-*a*/430-*b* associated with the first memory sub-bank 405-*a*) may receive data from a plurality of memory cells, amplify the data, and latch the data for read-out on the IO lines 435. Upon addressing a memory sub-bank 405 during a store command, data on the IO lines 435 may be amplified by the sense amplifiers in a row buffer 430 and stored in a plurality of memory cells.

The bank control circuit 420 may provide a number of control signals to the sense amplifiers of a row buffer 430. In some examples, the control signals may include a bank select (BS) signal, a plate voltage (PL), an isolation gate control signal (TG), a bit line pre-charge signal (PCB), a sense amplifier pre-charge signal (PCS), a reference voltage application signal (REF), or a sense circuit activation signal (CS). Example uses of these signals when loading or storing data within a memory bank is described with reference to FIGS. 9-14, 16, and 17, and may be applied in a similar manner to loading or storing data within a memory sub-bank.

The per-memory bank control circuits 320 described with reference to FIG. 3 may be used to provide independent interleaved access to memory banks 305, but may take more chip area than the shared bank control circuit 420 described with reference to FIG. 4. However, by providing a sub-bank address to the shared bank control circuit 420, along with a bank address, reading and writing of all row buffers associated with all memory sub-banks is possible. Loading and storing processes for some memory sub-banks 405 and reading and writing processes for other memory sub-banks 405 may be interleaved. However, in the case of loading and/or storing processes for some memory sub-banks 405 in the same area 400, memory sub-bank interleaving may not be available.

Figure 5:
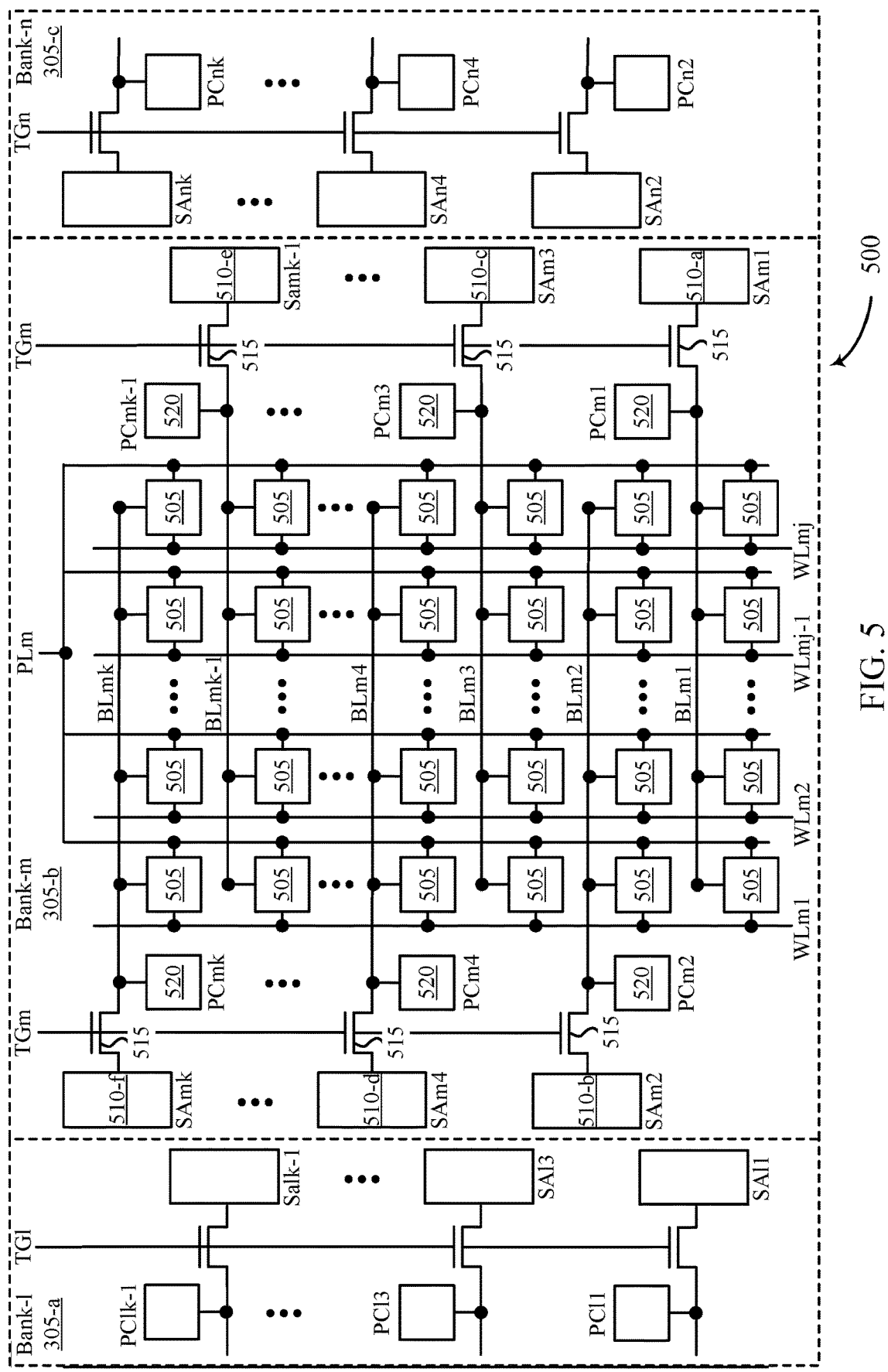
FIG. 5 illustrates an apparatus including a plurality of memory banks, such as a plurality of memory banks of the memory device, the memory blocks, or the memory areas described with reference to FIGS. 1-4, in accordance with various embodiments of the present disclosure.

FIG. 5 illustrates an apparatus 500 including a plurality of memory banks 305, such as a plurality of memory banks of the memory device 100, the memory blocks 105, or the memory areas 205 described with reference to FIGS. 1-4, in accordance with various embodiments of the present disclosure. In some examples, the apparatus 500 may include a first memory bank 305-a, a second memory bank 305-b, and a third memory bank 305-c. The apparatus 500 may alternatively include more or fewer memory banks 305.

Each of the memory banks 305 may include a plurality of memory cells 505 that are programmable to store different states. For example, each memory cell 505 may be programmable to store two states, denoted a logic 0 and a logic 1. In some cases, a memory cell 505 may be configured to store more than two logic states. A memory cell 505 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Ferroelectric materials have non-linear polarization properties.

Operations such as reading and writing may be performed on the memory cells 505 by activating or selecting an appropriate word line (WL) and bit line (BL). In some cases, a bit line may be referred to as a digit line. Activating or selecting a word line or bit line may include applying a voltage potential to the respective line. Word lines and bit lines may be made of conductive materials. In some examples, the word lines and bit lines may be made of metals (e.g., copper, aluminum, gold, tungsten, etc.). Each row of memory cells 505 may be connected to a single word line (e.g., to WLm1, WLm2, WLmj−1, or WLmj, where m is a memory bank indicator and j is a number of word lines addressing a memory bank 305), and each column of memory cells 505 may be connected to a single bit line (e.g., to BLm1, BLm2, BLm3, BLm4, BLmk−1, or BLmk, where k is a number of bit lines addressing a memory bank). The intersection of a word line and a bit line may be referred to as an address of a memory cell. By activating one word line and all of the bit lines associated with a memory bank 305, a data word may be read into a row buffer including a plurality of sense amplifiers 510 (including, e.g., the sense amplifiers SAm1 510-a, SAm2 510-b, SAm3 510-c, SAm4 510-d, SAmk−1 510-e, and SAmk 510-f).

In some architectures, the logic storing device of a memory cell 505, e.g., a capacitor, may be electrically isolated from a bit line by a selection device. The word line may be connected to and may control the selection device. For example, the selection device may be a transistor and the word line may be connected to the gate of the transistor. Activating the word line may result in an electrical connection between the capacitor of the memory cell 505 and its corresponding bot line. Upon activating the word line associated with a memory cell 505 may enable the bit line associated with the memory cell 505 to be accessed for the purpose of reading or writing the memory cell 505.

Upon accessing a memory cell 505 during a read operation, a logic value stored in the memory cell 505 may be sensed by the sense amplifier 510 associated with the memory cell's bit line. For example, the sense amplifier 510 may compare a logic value (e.g., a voltage) of the relevant bit line to a reference signal (e.g., a reference voltage, not shown) in order to determine the stored state or logic value of the memory cell 505. For example, when the bit line has a higher voltage than the reference voltage, the sense amplifier 510 may determine that the stored state in the memory cell 505 is a logic one or high-level logic value, and when the bit line has a lower voltage than the reference voltage, the sense amplifier 510 may determine that the stored state in the memory cell 505 is a logic zero or low-level logic value. A sense amplifier 510 may include various transistors or amplifiers in order to detect and amplify a difference in voltages, which may be referred to as latching. The detected logic state of a memory cell 505 may then be output on an IO line.

A memory cell 505 may be set, or written, by similarly activating a relevant word line and digit line for the memory cell 505. As discussed above, activating a word line electrically connects a corresponding row of memory cells 505 to their respective bit lines. By controlling a relevant bit line for a memory cell 505 while the word line associated with the memory cell 505 is activated, the memory cell 505 may be written—i.e., a logic value may be stored in the memory cell 505. In the case of a memory cell having a ferroelectric capacitor, the memory cell 505 may be written by applying a voltage across the ferroelectric capacitor.

In some memory architectures, accessing a memory cell 505 may degrade or destroy the stored logic state, and re-write or refresh operations may be performed to return the original logic state to the memory cell 505. In a DRAM, for example, the capacitor may be partially or completely discharged during a sense operation, corrupting the stored logic state. A stored logic state may therefore be re-written after a sense operation. Additionally, activating a single word line may result in the discharge of all memory cells in the row; and thus, all memory cells 505 in the row may need to be re-written.

Some memory architectures, including DRAM architectures, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

Each bit line of the second memory bank 305-b may be selectively coupled to an input terminal of a respective sense amplifier in a row buffer. For example, each of a plurality of isolation gates 515 (e.g., nMOS transistors) may have source and drain terminals coupled, respectively, to a bit line (e.g., BLm1, BLm2, BLm3, BLm4, BLmk−1, or BLmk) of the second memory bank 305-b and a corresponding one of the sense amplifiers (e.g., the sense amplifier SAm1 510-a, SAm2 510-b, SAm3 510-c, SAm4 510-d, SAmk−1 510-e, or SAmk 510-f). A region control signal (TGm) applied to the gate terminals of the isolation gates 515 may operate the isolation gates 515 to open the isolation gates 515 and decouple the bit lines of the second memory bank 305-b from the sense amplifiers 510, or close the isolation gates 515 and couple the bit lines of the second memory bank 305-b to the sense amplifiers 510. When the isolation gates 515 are closed, a data word may be read from or written to a row of memory cells 505 associated with an activated word line.

Each of the bit lines may be associated with a bit line pre-charge circuit 520. During a read of a row of memory cells 505, the bit line pre-charge circuits 520 may pre-charge the bit lines to a low level while the isolation gates 515 are open. A word line may then be activated, and the isolation gates 515 may be closed to couple the bit lines to the sense amplifiers 510 and read a data word stored in the memory cells 505 associated with the activated word line onto the bit lines. The sense amplifiers 510 may then compare the voltages of the bit lines to a reference voltage to determine the stored states of the memory cells 505. The stored states of the memory cells 505 may be stored (e.g., latched) at the sense amplifiers 510. When a next access of the second memory bank 305-b is associated with the same word line as an immediate prior access, the data stored in the memory cells may be read from the sense amplifiers 510 instead of the memory cells 505. Accessing the data stored in the sense amplifiers 510 can save one or more additional accesses of the memory cells. When data stored in a subset of memory cells 505 is read from the sense amplifiers 510 instead of the memory cells 505, the memory cells 505 need not be coupled to the sense amplifiers 510 and the isolation gates 515 may remain open. Also, the bit lines may be pre-charged to the same voltage level as the plate voltage (PLm) of the memory cells 505. When both the plate voltages and the bit lines are held at the same voltage (e.g., a low voltage level, such as VSS), the leakage currents associated with the memory cells 505 are minimized, and the longevity of the memory cells 505 may be extended.

Figure 6:
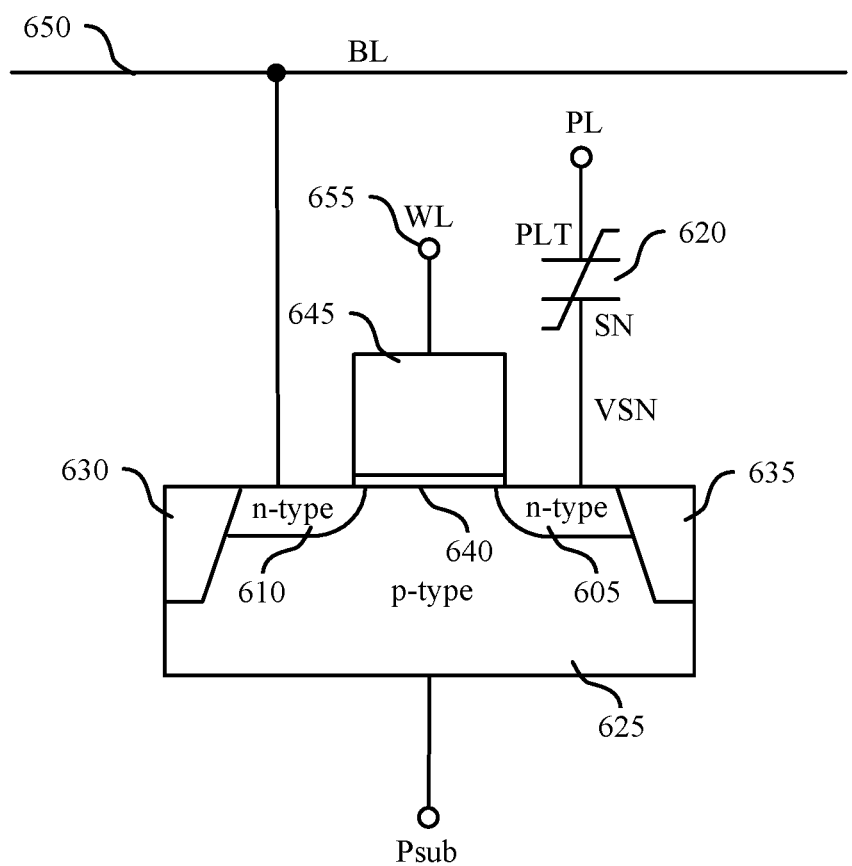
FIG. 6 illustrates an example ferroelectric memory cell, in accordance with various embodiments of the present disclosure.

FIG. 6 illustrates an example ferroelectric memory cell 600, in accordance with various embodiments of the present disclosure. The ferroelectric memory cell 600 may include a selection device and a logic storage component. The selection device may include a transistor having a source terminal 605, a drain terminal 610, and a gate terminal 645. The logic storage component may include a capacitor 620 that includes two conductive electrodes, a cell plate electrode (PLT), and a storage node electrode (SN). The electrodes of the capacitor 620 may be separated by an insulating ferroelectric material. As described above, various states may be stored by charging or discharging the capacitor 620.

In some examples, the source and drain terminals 605, 610 may be n-type impurity layers (or wells) formed in a p-type silicon substrate 625. The source and drain terminals 605, 610 may be insulated from other active regions by element separation insulating films 630 and 635. A gate dielectric film 640 may be formed on a portion of the source terminal 605, the substrate 625, and the drain terminal 610. A gate terminal 645 may be formed on the gate dielectric film 640.

The source terminal 605 may be coupled to the storage node electrode (SN) of the capacitor 620 by a first metal line and/or conductive via (e.g., at a storage node (VSN)). The cell plate electrode (PLT) of the capacitor 620 may be coupled to a cell plate node (PL) by a second metal line and/or conductive via. The drain terminal 610 may be coupled to a bit line (BL) 650 by a third metal line and/or conductive via. The gate terminal 645 may be coupled to a word line (WL) 655 by a fourth metal line and/or conductive via.

In operation, a high voltage level (e.g., VPP) may be applied to the word line (WL) 655 to activate the selection device and induce a current flow between the storage node (VSN) and the bit line (BL) 650. Conversely, a low voltage level (e.g., VKK) may be applied to the word line (WL) 655 to de-activate the selection device and retard current flow between the storage node (VSN) and the bit line (BL) 650. When the word line (WL) 655 is at the low voltage level, the voltages of the cell plate node (PL), the bit line (BL) 650, and the substrate 625 (e.g., the Psub voltage) may be held at a low voltage level (e.g., VSS) to reduce leakage currents in the selection device. This state, in which the word line (WL) 655 is held at the low voltage level, and the voltages of the cell plate node (PL), the bit line (BL) 650, and the substrate 625 are held at a low voltage level (e.g., VSS), may be maintained as the data stored in the memory cell 600 is read from a sense amplifier coupled to the bit line (BL) 650 instead of the memory cell 600. In other words, the voltage level of the word line (WL) 655 may be held at the low voltage level (e.g., VKK), and the voltage on the bit line (BL) 650 may be allowed to fluctuate as a result of current flow through the selection device, when data stored in the memory cell 600 is being loaded into a sense amplifier, or when new data is being written into the memory 600.

Figure 7:
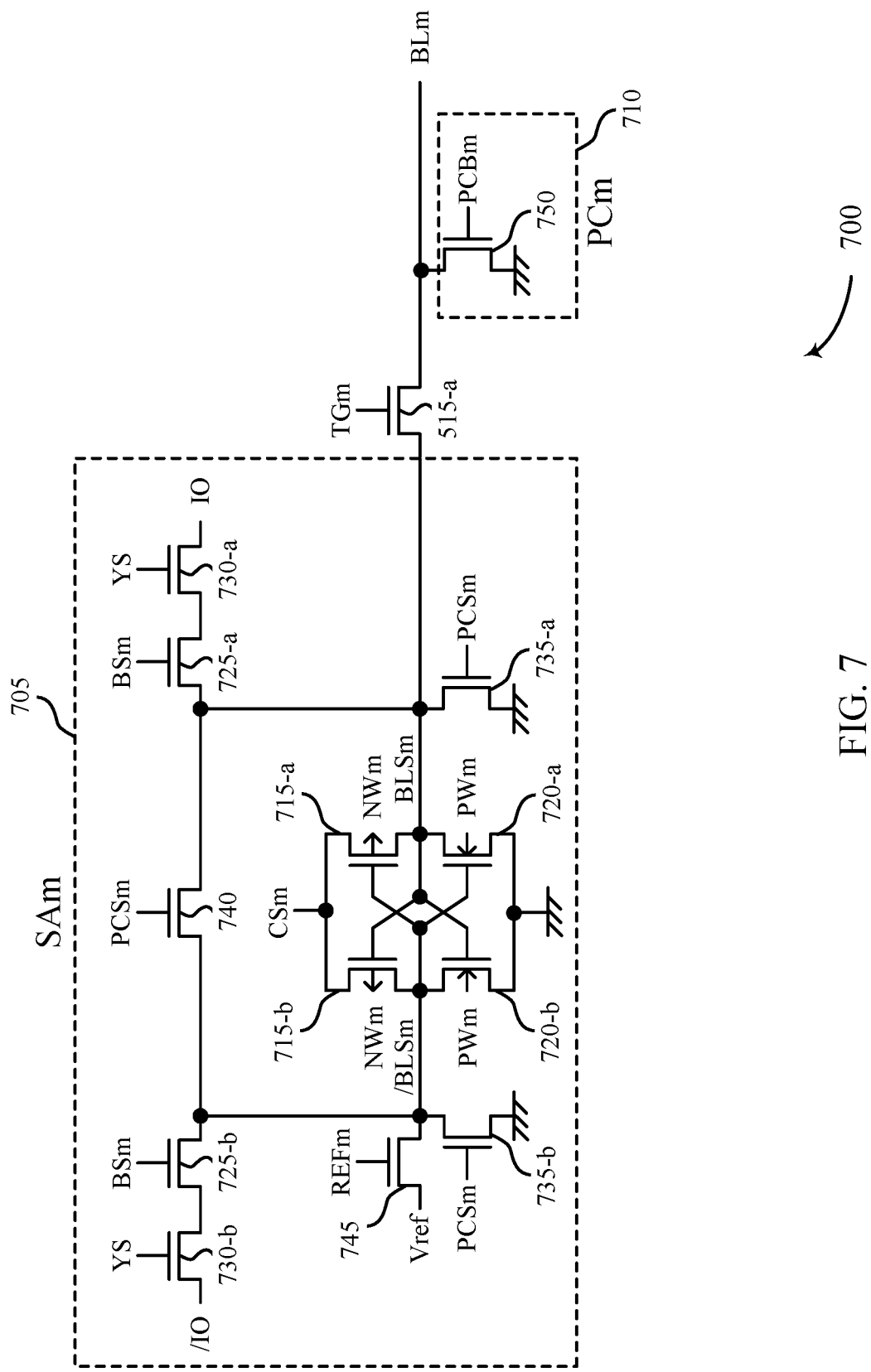
FIG. 7 illustrates an example circuit diagram of a sense amplifier and a bit line pre-charge circuit, in accordance with various embodiments of the present disclosure.

FIG. 7 illustrates an example circuit diagram 700 of a sense amplifier 705 and a bit line pre-charge circuit 710, in accordance with various embodiments of the present disclosure. In some examples, the sense amplifier 705 may be an example embodiment of one of the sense amplifiers 510 described with reference to FIG. 5. In some examples, the sense amplifier 705 may include a sense circuit that compares the voltages on nodes BLSm and /BLSm, where /BLSm is a complimentary (or differential) node with respect to BLSm, and where the notation "m" in BLSm and other signals indicates that the signals are generated for a memory bank "m". The sense circuit may latch the sense voltages. By way of example, the sense circuit may include a set of four transistors, including two pMOS transistors 715-a, 715-b and two nMOS transistors 720-a, 720-b. The sense amplifier 705 may also include a first pair of transistors (e.g., nMOS transistors 725-a and 730-a) and a second pair of transistors (e.g., nMOS transistors 725-b and 730-b) for respectively coupling the BLSm and /BLSm nodes to the nodes IO and /IO of an I/O register. The source and drain terminals of each pair of transistors may be coupled in series between one of the nodes BLSm or /BLSm and one of the I/O register nodes IO or /IO. The gate terminal of one transistor in each pair (e.g., the gate terminals of transistors 725-a and 725-b) may be driven by a bank select signal BSm, and the gate terminal of the other transistor in each pair (e.g., the gate terminals of transistors 730-a and 730-b) may be driven by a column selection signal YS.

The sense amplifier 705 may include a sense amplifier pre-charge circuit operable to bias the nodes BLSm and /BLSm to a first voltage (e.g., VSS) prior to loading (in the sense amplifier 705) data stored in a memory cell connected to the bit line BLm. The sense amplifier pre-charge circuit may include a pair of transistors 735-a, 735-b coupled by source and drain terminals between a low voltage potential (e.g., VSS or ground) and the node BLSm or /BLSm, and having gate terminals driven by a sense amplifier pre-charge (PCSm) signal. A third transistor 740, coupled by source and drain terminals between the nodes BLSm and /BLSm, may also have a gate terminal driven by the PCSm signal.

The sense amplifier 705 may also include a bias circuit operable to bias the node /BLSm to a reference voltage (Vref). The node /BLSm may be biased to the reference voltage after pre-charging the nodes BLSm and /BLSm to the low voltage potential, and prior to loading (in the sense amplifier 705) data stored in a memory cell connected to the bit line BLm. The bias circuit may include a transistor 745 coupled by source and drain terminals between the node /BLSm and a node maintained at the reference voltage (Vref) potential. The gate terminal of the transistor 745 may be driven by a REFm signal.

The bit line pre-charge circuit 710 may include a transistor 750 coupled by source and drain terminals between the bit line BLm and a low voltage potential (e.g., VSS or ground). The gate terminal of the transistor 750 may be driven by a bit line pre-charge (PCBm) signal. The PCBm signal may be asserted to pull the bit line BLm to a low level (e.g., VSS) when not loading data from a memory cell to the sense amplifier 705 via the bit line BLm.

The bit line BLm may be coupled to the sense amplifier 705 by an isolation gate 515-a. The isolation gate 515-a may include a transistor coupled by source and drain terminals between the bit line BLm and the node BLSm. The gate terminal of the transistor may be driven by a region control signal TGm, as described with reference to FIG. 5.

Figure 8:
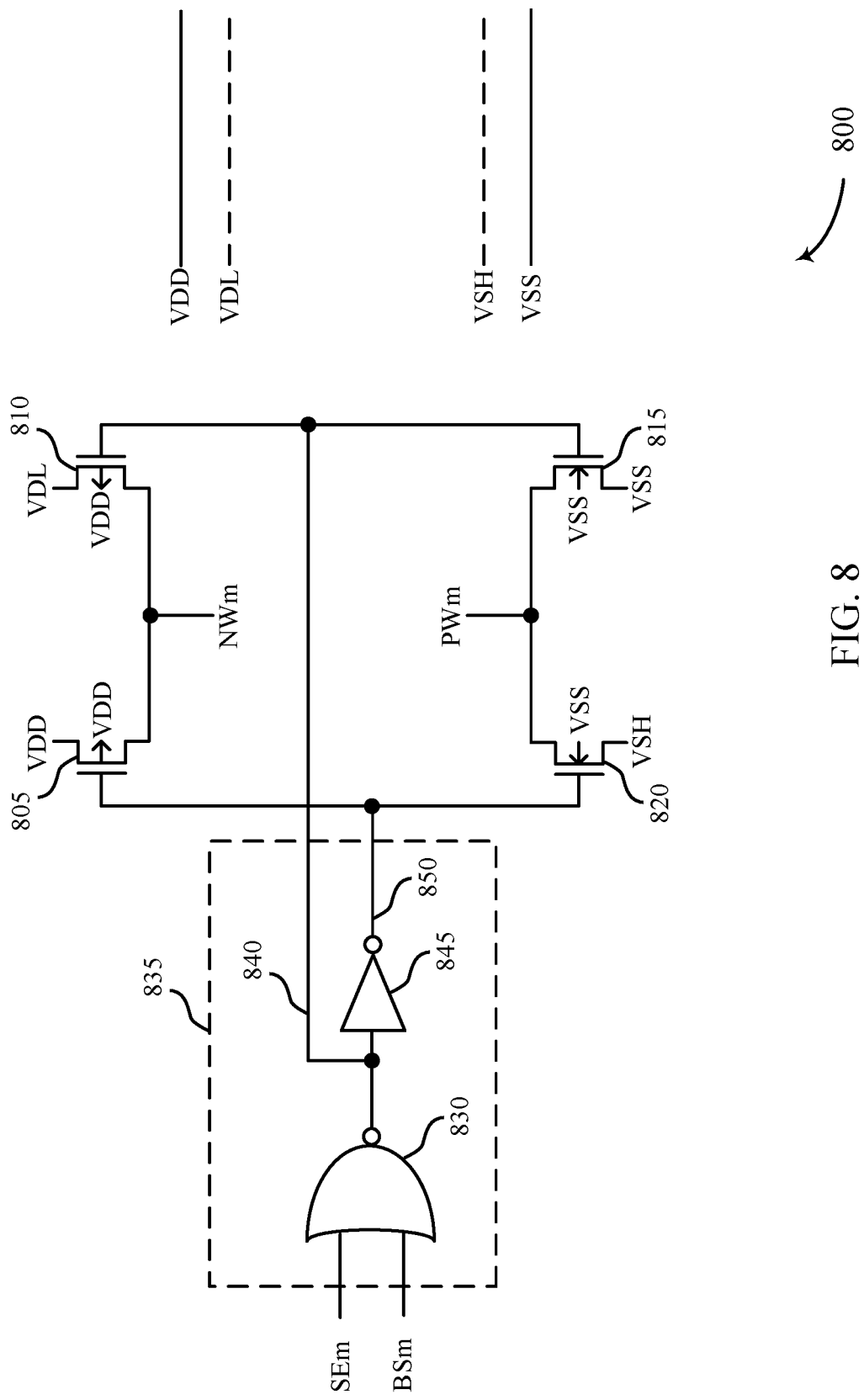
FIG. 8 illustrates an example circuit diagram of a sense latch (e.g., sense circuit) substrate control circuit, in accordance with various embodiments of the present disclosure.

FIG. 8 illustrates an example circuit diagram of a sense latch (e.g., sense circuit) substrate control circuit 800, in accordance with various embodiments of the present disclosure. The sense latch substrate control circuit 800 may be used to provide a first set of substrate voltages (e.g., VDD and VSS) or a second set of substrate voltages (e.g., VDL and VSH) to a sense circuit such as the sense circuit described with reference to FIG. 7. The first set of substrate voltages may include a first pMOS substrate voltage, VDD, and a first nMOS substrate voltage, VSS. The second set of substrate voltages may include a second pMOS substrate voltage, VDL, and a second nMOS substrate voltage, VSH. The first pMOS substrate voltage (VDD) may be higher than the second pMOS substrate voltage (VDL), and the first nMOS substrate voltage (VSS) may be lower than the second nMOS substrate voltage (VSH). A voltage selection circuit 835 may configure the sense latch substrate control circuit 800 to output a pMOS substrate voltage (at node NWm) and a nMOS substrate voltage (at node PWm). The voltages at nodes NWm and PWm may be used to configure a sense circuit of a sense amplifier (e.g., the sense circuit of the sense amplifier 705 described with reference to FIG. 7) using the first set of substrate voltages or the second set of substrate voltages. The first set of substrate voltages may provide a higher threshold voltage for the sense circuit at other times, thereby reducing the leakage current of a row buffer including the sense amplifier. The second set of substrate voltages may provide a lower threshold voltage (Vt) for the sense circuit when loading data stored in a memory cell into the sense amplifier, when storing data stored in the sense amplifier in a memory cell, when reading data from the sense amplifier, or when writing data to the sense amplifier.

In some examples, the sense latch substrate control circuit 800 may include a first pMOS transistor 805, a second pMOS transistor 810, a first nMOS transistor 815, and a second nMOS transistor 820. The first pMOS transistor 805 may be coupled by source and drain terminals between a node NWm and a node maintained at the first pMOS substrate voltage, VDD. In some examples, the node NWm may provide a pMOS substrate voltage to the sense circuit of the sense amplifier 705 described with reference to FIG. 7. The second pMOS transistor 810 may be coupled by source and drain terminals between the node NWm and the second pMOS substrate voltage, VDL. The first nMOS transistor 815 may be coupled by source and drain terminals between a node PWm and a node maintained at the first nMOS substrate voltage, VSS. In some examples, the node PWm may provide a nMOS substrate voltage to the sense circuit of the sense amplifier 705 described with reference to FIG. 7. The second nMOS transistor 820 may be coupled by source and drain terminals between the node PWm and the second nMOS substrate voltage, VSH.

The voltage selection circuit 835 may include a NOR gate 830 having, as inputs, a sense amplifier enable (SEm) signal and a bank selection (BSm) signal. The output of the NOR gate 830 may provide a non-inverted output 840 of the voltage selection circuit 835. The non-inverted output 840 of the voltage selection circuit 835 may be received by an inverter 845. The output of the inverter 845 may provide an inverted output 850 of the voltage selection circuit 835. The gate terminals of the second pMOS transistor 810 and the first nMOS transistor 815 may be coupled to the non-inverted output 840, and the gate terminals of the first pMOS transistor 805 and second nMOS transistor 820 may be coupled to the inverted output 850.

In operation, assertion of the SEm signal (during a load or store operation) or the BSm signal (during a read or write operation) causes the non-inverted output 840 of the voltage selection circuit 835 to be pulled to a low level, causing the inverted output 850 of the voltage selection circuit 835 to be pulled to a high level, causing the second pMOS transistor 810 to conduct and pull the node NWm to VDL, and causing the second nMOS transistor 820 to conduct and pull the node PWm to VSH. Absent the SEm signal and BSm signal being asserted, the non-inverted output 840 of the voltage selection circuit 835 is pulled to a high level, causing the inverted output 850 of the voltage selection circuit 835 to be pulled to a low level, causing the first pMOS transistor 805 to conduct and pull the node NWm to VDD, and causing the first nMOS transistor 815 to conduct and pull the node PWm to VSS.

Figure 9:
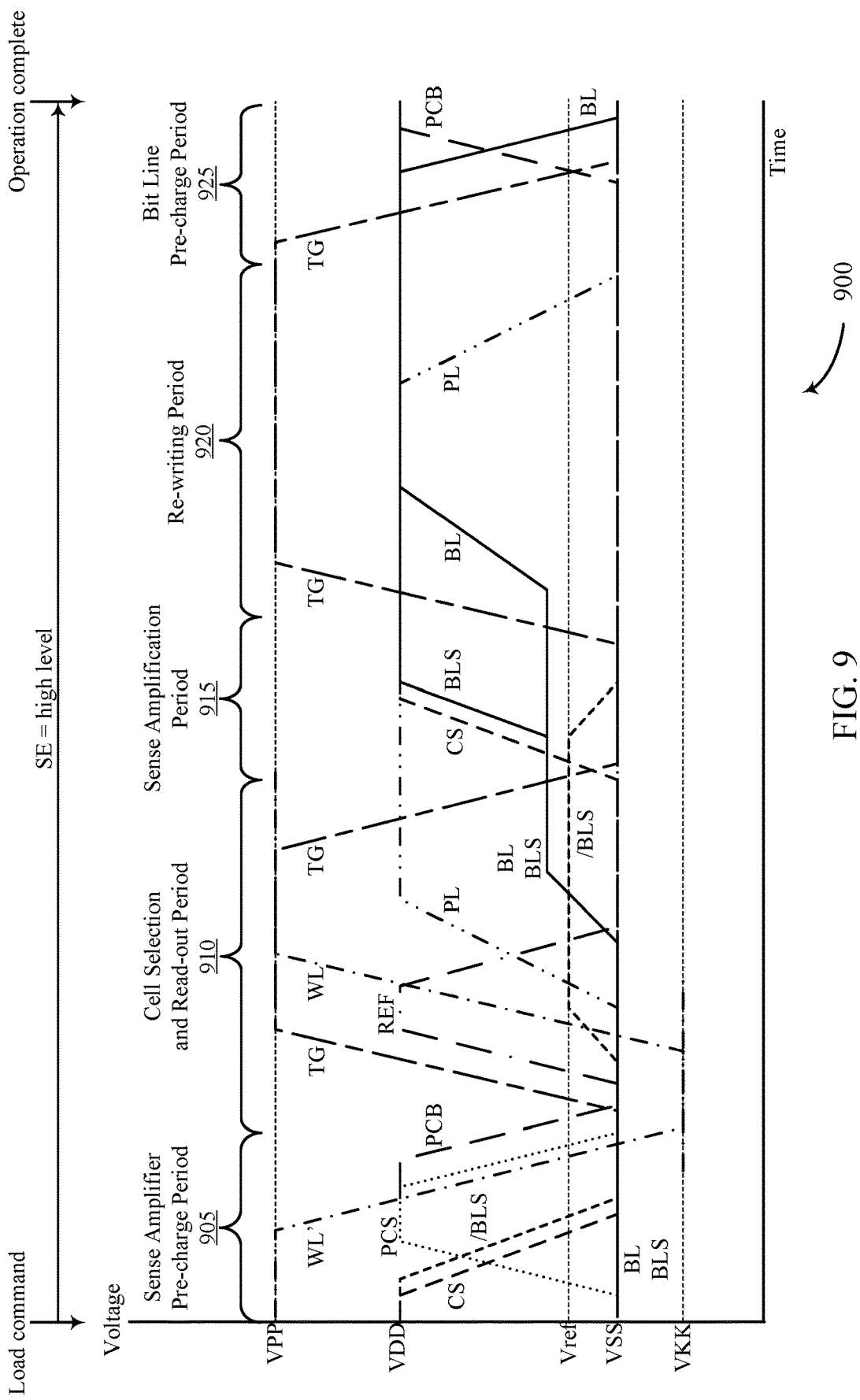
FIG. 9 illustrates example waveforms that may be applied to various terminals, or which may appear on various nodes, upon issuing a load command and loading a logic one or high-level logic value from a memory cell to a sense amplifier, in accordance with various embodiments of the present disclosure.

FIG. 9 illustrates example waveforms 900 that may be applied to various terminals, or which may appear on various nodes, upon issuing a load command and loading a logic one or high-level logic value from a memory cell to a sense amplifier, in accordance with various embodiments of the present disclosure. By way of example, the sense amplifier is assumed to store a low-level logic value prior to the load of the high-level logic value. By way of further example, the memory cell may be one of the memory cell 505 or 600 described with reference to FIG. 5 or 6, and the sense amplifier may be one of the sense amplifiers described with reference to FIG. 5.

During a sense amplifier pre-charge period 905, the PCS signal may be switched from a low level (VSS) to a high level (VDD), and the CS signal may be switched from a high level (VDD) to a low level (VSS). Switching the PCS signal to the high level enables a sense amplifier pre-charge circuit including a pair of pull-down transistors that pull the /BLS node to the low level (VSS) and hold the BLS node at the low level (VSS). Also during the sense amplifier pre-charge period, a previously asserted word line (WL') may be switched from a high level (VPP) to a low level (VKK). After switching the previously asserted word line, the PCS signal may be switched from a high level (VDD) to a low level (VSS), thereby disabling the sense amplifier pre-charge circuit, and the PCB signal may be switched from a high level (VDD) to a low level (VSS), thereby disabling the bit line pre-charge circuit.

During a cell selection and read-out period 910 following the sense amplifier pre-charge period 905, the TG signal may be switched from a low level (VSS) to a high level (VPP) to close the isolation gate and couple a bit line (BL) to the BLS node. Substantially in parallel with closing the isolation gate, the REF signal may be switched from a low level (VSS) to a high level (VDD) to drive the gate of a transistor that applies a reference voltage (Vref) to the /BLS node. A word line (WL) may then be asserted (transitioned from a low level (VKK) to a high level (VPP)) to select a set of memory cells storing a data word and read a stored logic value onto the bit line (BL) and the BLS node. By way of example, FIG. 9 shows the logic value to be a logic one or high-level logic value. Substantially in parallel with asserting the word line (WL), the cell plate voltage (PL) of the set of memory cells may be switched from a low level (VSS) to a high level (VDD), and the REF signal may be switched from the high level (VDD) to the low level (VSS). Raising the cell plate voltage may cause the stored logic value to be read from the memory cells. After reading the stored logic value onto the bit line and BLS node, the TG signal may be switched from the high level (VPP) to the low level (VSS) to open the isolation gate and de-couple the bit line (BL) from the BLS node.

During a sense amplification period 915 following the cell selection and read-out period 910, the CS signal may be switched from the low level (VSS) to the high level (VDD), causing the sense amplifier to amplify a difference between the logic value read onto the BLS node and the reference signal (Vref) applied to the /BLS node. The amplification drives the BLS node to a high level (VDD) and drives the /BLS node to a low level (VSS). Following amplification of the logic value read onto the BLS node, the TG signal may be switched from a low level (VSS) to a high level (VPP), again closing the isolation gate in a re-writing period 920 following the sense amplification period 915.

During the re-writing period 920, the amplified logic level on the BLS node (i.e., a logic one) is transferred back to the bit line (BL). The cell plate voltage (PL) may then be switched from the high level (VDD) to the low level (VSS) to re-write the logic one or high-level logic value to the memory cell.

During a bit line pre-charge period 925 following the re-writing period 920, the TG signal may be switched form the high level (VPP) to the low level (VSS), again opening the isolation gate. Also, the PCB signal may be switched from a low level (VSS) to a high level (VDD), causing the bit line (BL) to transition from the high level (VDD) to the low level (VSS). After the bit line is pre-charged, both the plate voltage and the bit line voltage may be held at the same voltage (e.g., a low voltage level, such as VSS), thereby mitigating leakage currents associated with the memory cell and extending the longevity of the memory cell.

The waveforms 900 assume the memory cell is configured to operate in a destructive reading mode. If the memory cell is not configured to operate in a destructive reading mode, data need not be transferred back to the memory cell during the re-writing period 920.

Figure 10:
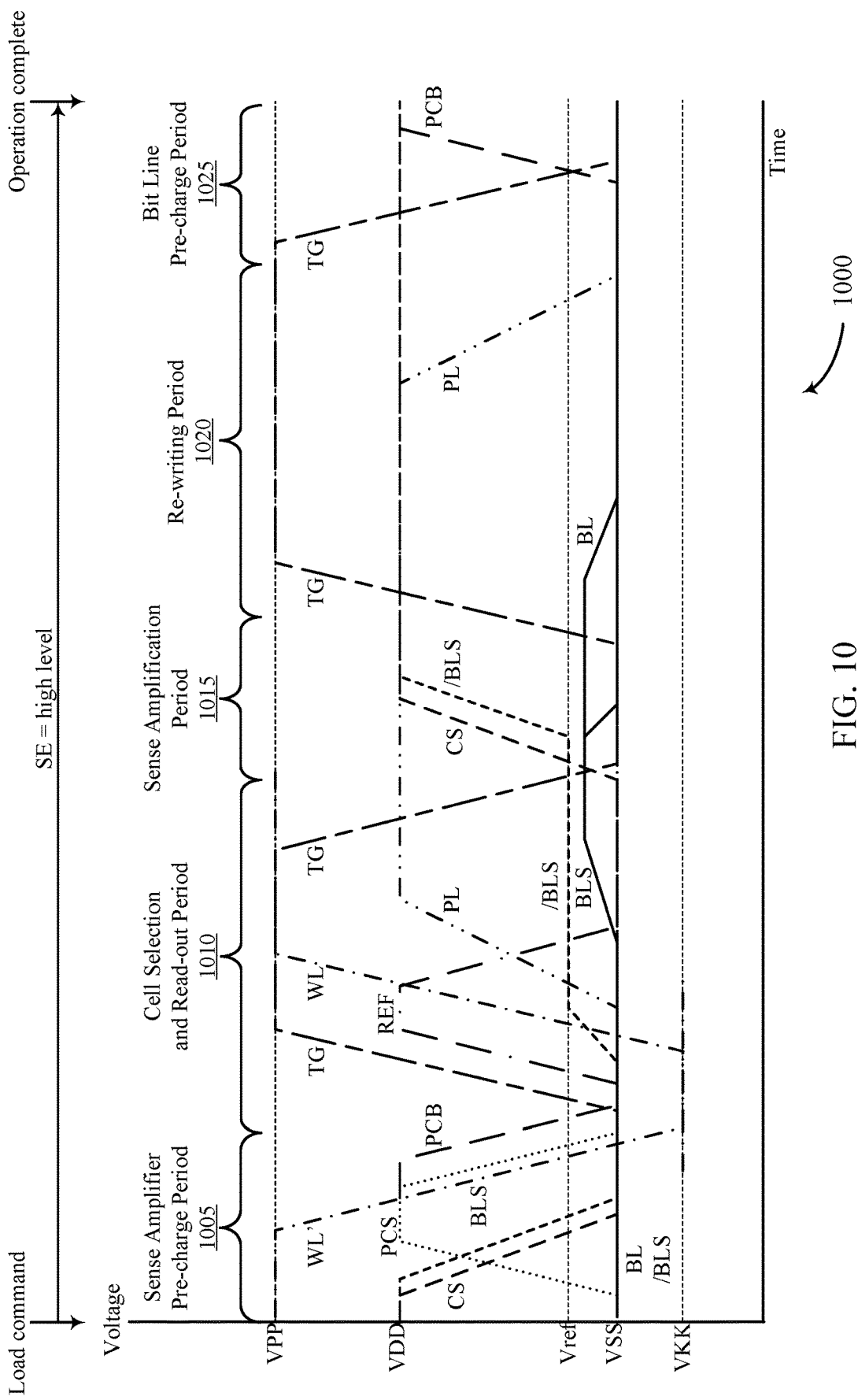
FIG. 10 illustrates example waveforms that may be applied to various terminals, or which may appear on various nodes, upon issuing a load command and loading a logic zero or low-level logic value from a memory cell to a sense amplifier, in accordance with various embodiments of the present disclosure.

FIG. 10 illustrates example waveforms 1000 that may be applied to various terminals, or which may appear on various nodes, upon issuing a load command and loading a logic zero or low-level logic value from a memory cell to a sense amplifier, in accordance with various embodiments of the present disclosure. By way of example, the sense amplifier is assumed to store a high-level logic value prior to the load of the low-level logic value. By way of further example, the memory cell may be one of the memory cell 505 or 600 described with reference to FIG. 5 or 6, and the sense amplifier may be one of the sense amplifiers described with reference to FIG. 5.

During a sense amplifier pre-charge period 1005, the PCS signal may be switched from a low level (VSS) to a high level (VDD), and the CS signal may be switched from a high level (VDD) to a low level (VSS). Switching the PCS signal to the high level enables a sense amplifier pre-charge circuit including a pair of pull-down transistors that pull the /BLS node to the low level (VSS) and hold the BLS node at the low level (VSS). Also during the sense amplifier pre-charge period, a previously asserted word line (WL') may be switched from a high level (VPP) to a low level (VKK). After switching the previously asserted word line, the PCS signal may be switched from a high level (VDD) to a low level (VSS), thereby disabling the sense amplifier pre-charge circuit, and the PCB signal may be switched from a high level (VDD) to a low level (VSS), thereby disabling the bit line pre-charge circuit.

During a cell selection and read-out period 1010 following the sense amplifier pre-charge period 1005, the TG signal may be switched from a low level (VSS) to a high level (VPP) to close the isolation gate and couple a bit line (BL) to the BLS node. Substantially in parallel with closing the isolation gate, the REF signal may be switched from a low level (VSS) to a high level (VDD) to drive the gate of a transistor that applies a reference voltage (Vref) to the /BLS node. A word line (WL) may then be asserted (transitioned from a low level (VKK) to a high level (VPP)) to select a set of memory cells storing a data word and read a stored logic value onto the bit line (BL) and the BLS node. By way of example, FIG. 10 shows the logic value to be a logic zero or low-level logic value. Substantially in parallel with asserting the word line (WL), the cell plate voltage (PL) of the set of memory cells may be switched from a low level (VSS) to a high level (VDD), and the REF signal may be switched from the high level (VDD) to the low level (VSS). Raising the cell plate voltage may cause the stored logic value to be read from the memory cells. After reading the stored logic value onto the bit line and BLS node, the TG signal may be switched from the high level (VPP) to the low level (VSS) to open the isolation gate and de-couple the bit line (BL) from the BLS node.

During a sense amplification period 1015 following the cell selection and read-out period 1010, the CS signal may be switched from the low level (VSS) to the high level (VDD), causing the sense amplifier to amplify a difference between the logic value read onto the BLS node and the reference signal (Vref) applied to the /BLS node. The amplification drives the BLS node to a low level (VSS) and drives the /BLS node to a high level (VDD). Following amplification of the logic value read onto the BLS node, the TG signal may be switched from a low level (VSS) to a high level (VPP), again closing the isolation gate in a re-writing period 1020 following the sense amplification period 1015.

During the re-writing period 1020, the amplified logic level on the BLS node (i.e., a logic zero) is transferred back to the bit line (BL) and the logic zero or low-level logic value is re-written to the memory cell. The cell plate voltage (PL) may then be switched from the high level (VDD) to the low level (VSS).

During a bit line pre-charge period 1025 following the re-writing period 1020, the TG signal may be switched form the high level (VPP) to the low level (VSS), again opening the isolation gate. Also, the PCB signal may be switched from a low level (VSS) to a high level (VDD), thereby re-enabling the bit line pre-charge circuit. After the bit line is pre-charged, both the plate voltage and the bit line voltage may be held at the same voltage (e.g., a low voltage level, such as VSS), thereby mitigating leakage currents associated with the memory cell and extending the longevity of the memory cell.

The waveforms 1000 assume the memory cell is configured to operate in a destructive reading mode. If the memory cell is not configured to operate in a destructive reading mode, data need not be transferred back to the memory cell during the re-writing period 1020.

Figure 11:
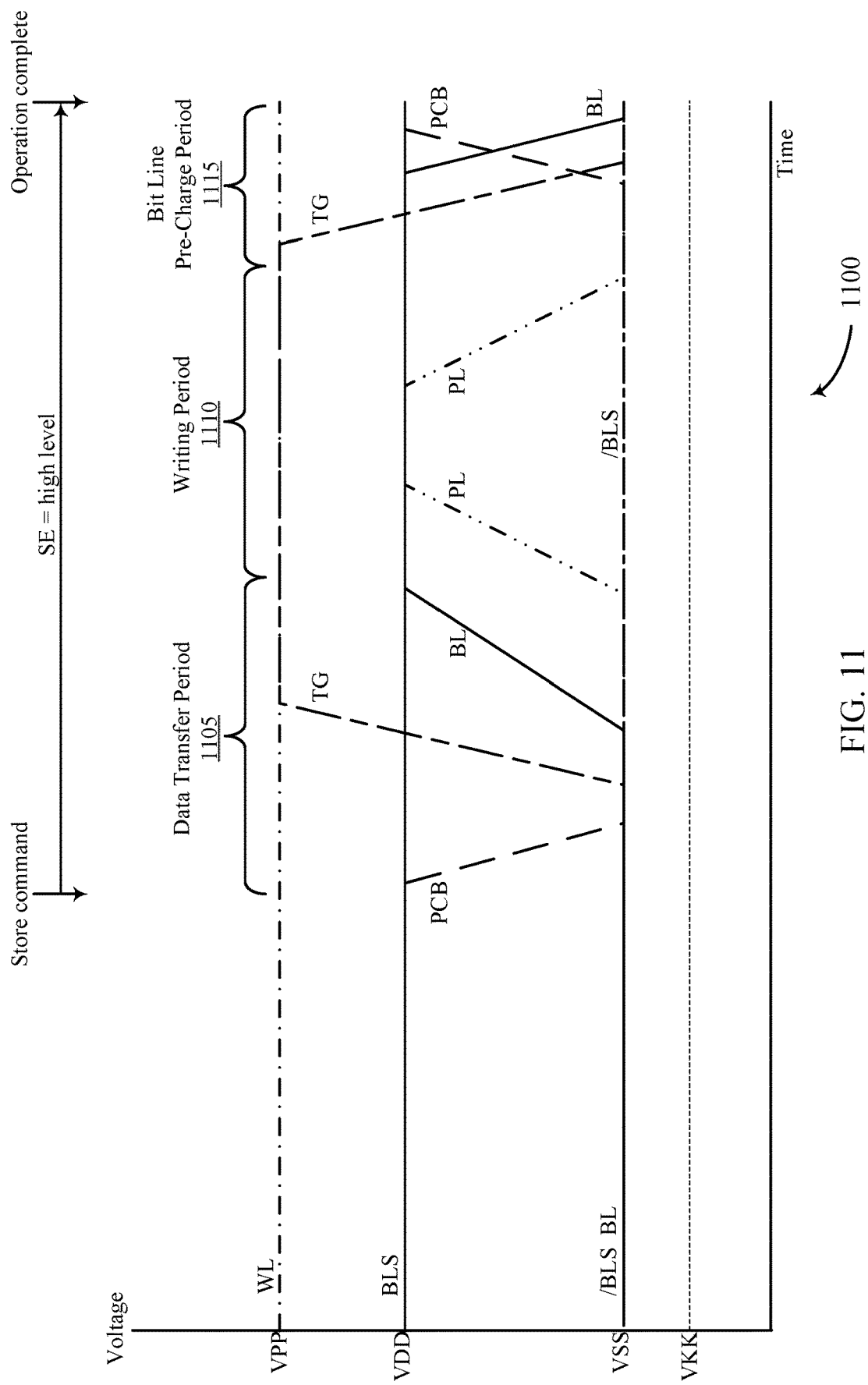
FIG. 11 illustrates example waveforms that may be applied to various terminals, or which may appear on various nodes, upon issuing a store command and storing a logic one or high-level logic value stored at a sense amplifier to a memory cell, in accordance with various embodiments of the present disclosure.

FIG. 11 illustrates example waveforms 1100 that may be applied to various terminals, or which may appear on various nodes, upon issuing a store command and storing a logic one or high-level logic value stored at a sense amplifier to a memory cell, in accordance with various embodiments of the present disclosure. By way of example, the memory cell may be one of the memory cell 505 or 600 described with reference to FIG. 5 or 6, and the sense amplifier may be one of the sense amplifiers described with reference to FIG. 5.

Prior to a data transfer period 1105, the BLS node of a sense amplifier may be pulled to a high level (VDD) representing the logic one to be stored, and the /BLS node of the sense amplifier may be pulled to a low level (VSS). Also prior to the data transfer period, a bit line (BL) coupled to a memory cell in which a logic one is to be stored may be held at a low level (VSS).

During a data transfer period 1105, the PCB signal may be switched from a high level (VDD) to a low level (VSS), thereby disabling a bit line pre-charge circuit. Also, the TG signal may be switched from a low level (VSS) to a high level (VPP) to close the isolation gate and couple a bit line (BL) to the BLS node. Closing the isolation gate causes the high level of the BLS node (i.e., the logic high to be stored) to be transferred to the bit line (BL).

During a writing period 1110, the cell plate voltage (PL) of the memory cell may be temporarily switched from a low level (VSS) to a high level (VDD), and then returned to the low level to re-write the logic one or high-level logic value to the memory cell.

During a bit line pre-charge period 1115 following the writing period, the TG signal may be switched form the high level (VPP) to the low level (VSS), again opening the isolation gate. Also, the PCB signal may be switched from a low level (VSS) to a high level (VDD), thereby re-enabling the bit line pre-charge circuit and causing the bit line (BL) to transition from the high level (VDD) to the low level (VSS). After the bit line is pre-charged, both the plate voltage and the bit line voltage may be held at the same voltage (e.g., a low voltage level, such as VSS), thereby mitigating leakage currents associated with the memory cell and extending the longevity of the memory cell.

Figure 12:
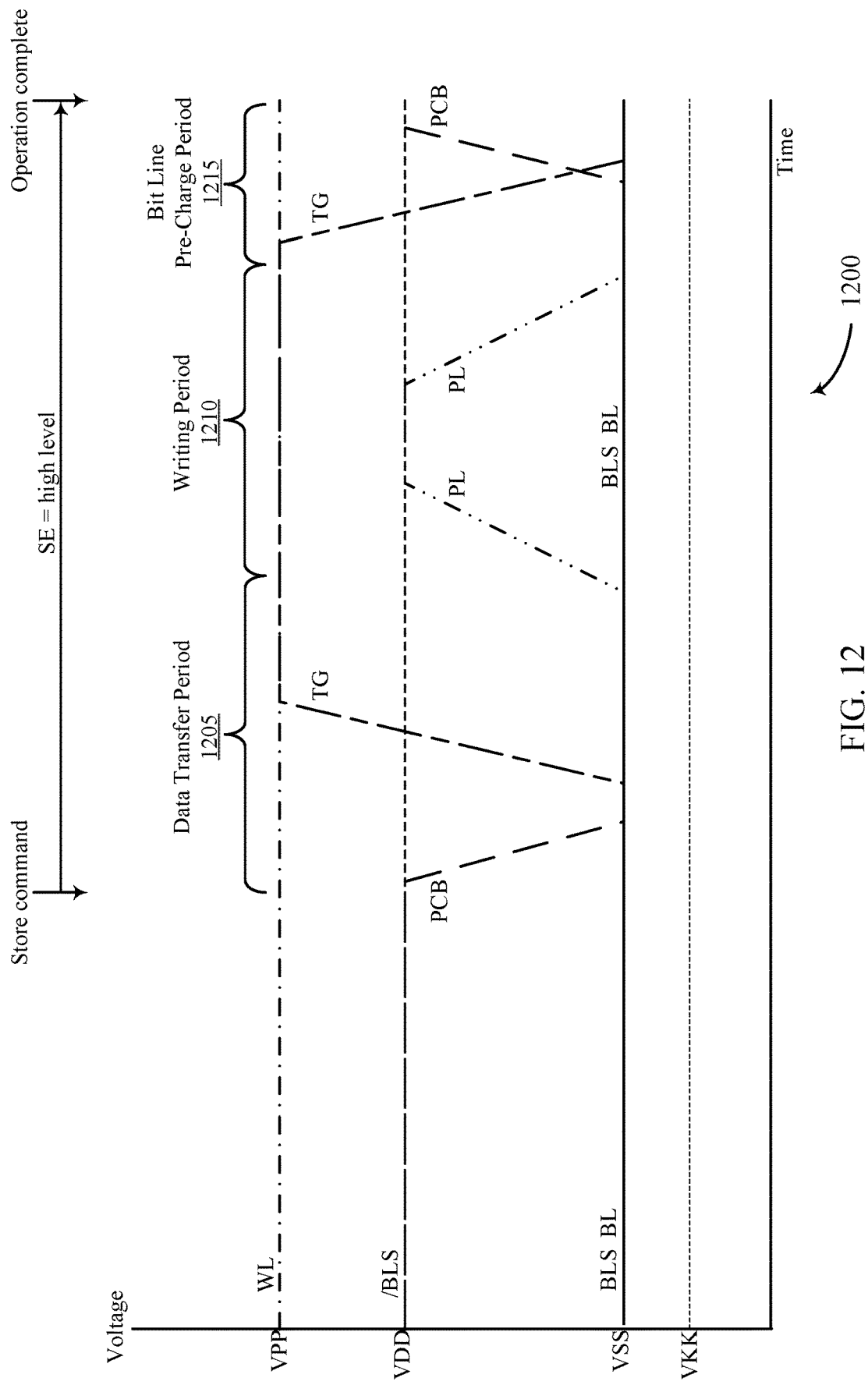
FIG. 12 illustrates example waveforms that may be applied to various terminals, or which may appear on various nodes, upon issuing a store command and storing a logic zero or low-level logic value stored at a sense amplifier to a memory cell, in accordance with various embodiments of the present disclosure.

FIG. 12 illustrates example waveforms 1200 that may be applied to various terminals, or which may appear on various nodes, upon issuing a store command and storing a logic zero or low-level logic value stored at a sense amplifier to a memory cell, in accordance with various embodiments of the present disclosure. By way of example, the memory cell may be one of the memory cell 505 or 600 described with reference to FIG. 5 or 6, and the sense amplifier may be one of the sense amplifiers described with reference to FIG. 5.

Prior to a data transfer period 1205, the BLS node of a sense amplifier may be pulled to a low level (VSS) representing the logic zero to be stored, and the/BLS node of the sense amplifier may be pulled to a high level (VDD). Also prior to the data transfer period, a bit line (BL) coupled to a memory cell in which the logic zero is to be stored may be held at a low level (VSS).

During a data transfer period 1205, the PCB signal may be switched from a high level (VDD) to a low level (VSS), thereby disabling a bit line pre-charge circuit. Also, the TG signal may be switched from a low level (VSS) to a high level (VPP) to close the isolation gate and couple a bit line (BL) to the BLS node. Closing the isolation gate causes the low level of the BLS node (i.e., the logic zero to be stored) to be transferred to the bit line (BL).

During a writing period 1210, the cell plate voltage (PL) of the memory cell may be temporarily switched from a low level (VSS) to a high level (VDD), at which the logic zero or low-level logic value may be re-written to the memory cell, and then the cell plate voltage may be returned to the low level.

During a bit line pre-charge period 1215 following the writing period, the TG signal may be switched form the high level (VPP) to the low level (VSS), again opening the isolation gate. Also, the PCB signal may be switched from a low level (VSS) to a high level (VDD), thereby re-enabling the bit line pre-charge circuit. After the bit line is pre-charged, both the plate voltage and the bit line voltage may be held at the same voltage (e.g., a low voltage level, such as VSS), thereby mitigating leakage currents associated with the memory cell and extending the longevity of the memory cell.

In some cases, wear leveling may be performed in conjunction with a load command, as described with reference to FIG. 16 or 17.

Figure 13:
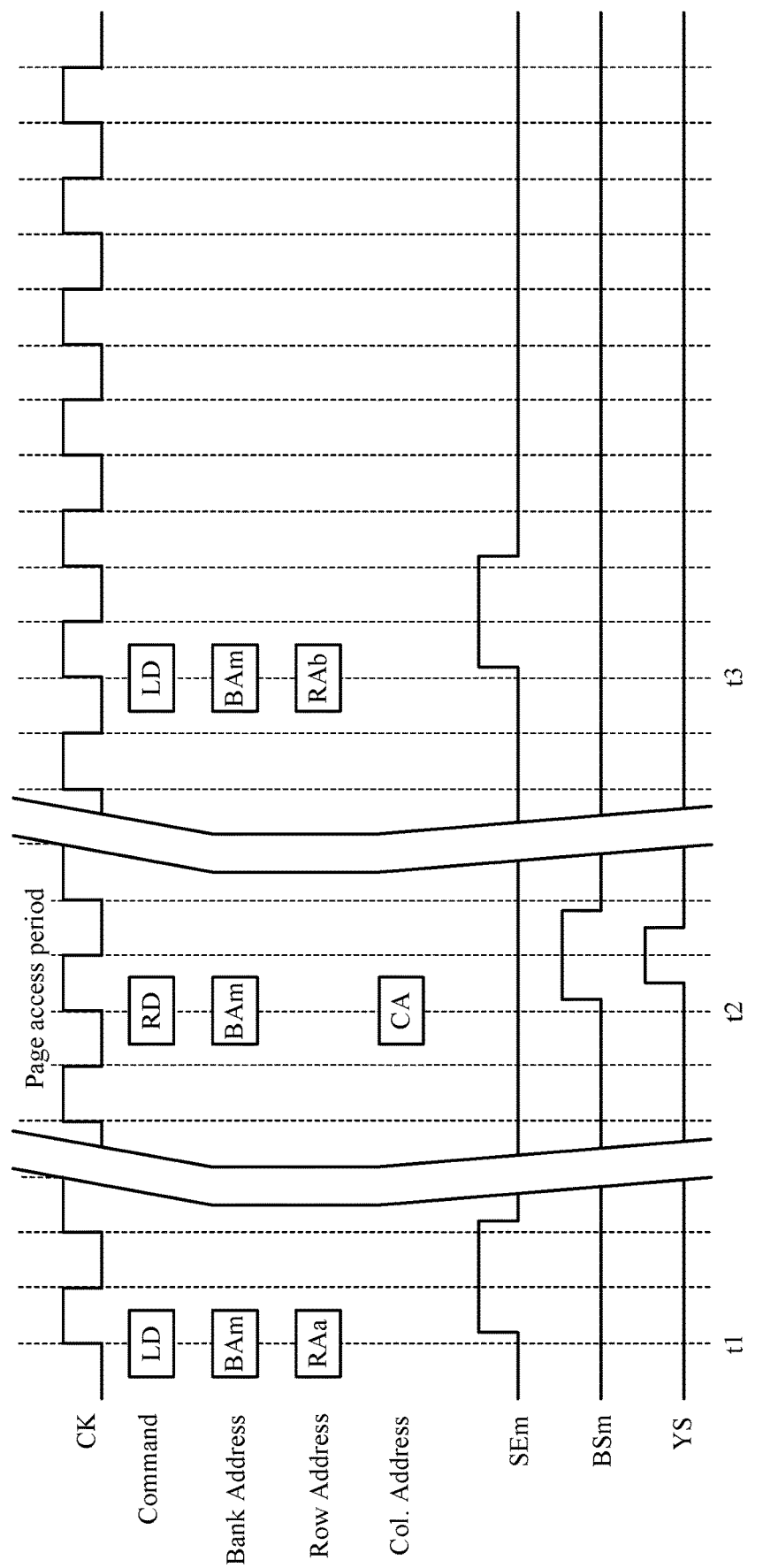
FIG. 13 illustrates an example sequence of operations in which a data word is loaded from a plurality of memory cells to a row buffer, and then read from the row buffer instead of the memory cells, in accordance with various embodiments of the present disclosure.

FIG. 13 illustrates an example sequence of operations 1300 in which a data word is loaded from a plurality of memory cells to a row buffer, and then read from the row buffer instead of the memory cells, in accordance with various embodiments of the present disclosure. By way of example, the memory cell may be one of the memory cell 505 or 600 described with reference to FIG. 5 or 6, and the sense amplifier may be one of the sense amplifiers described with reference to FIG. 5.

At time t1, a load command (LD) may be issued to load a first data word (stored in the plurality of memory cells) into the row buffer. The load command may be associated with a bank address (BAm) and a first row address (RAa) of the first data word. In some examples, the load command may executed as described with reference to FIG. 9 or 10. After the first data word is loaded into the row buffer, a number of read commands may be issued to read the first data word from the row buffer. For example, a read command (RD) associated with the bank address (BAm) and a column address (CA) may be issued at time t2, following time t1. Any number of additional read commands may be issued following time t1. Upon issuing a read command that returns a "miss", a load command may be issued at time t3 to load a second data word into the row buffer. The second data word may be associated with the bank address (BAm) and a second row address (RAb). The second data word may be read from the row buffer any number of times following the time t3. During a read of the row buffer, the memory cells that store a corresponding data word are not disturbed. For memory cells that can only be read a limited number of times, the caching of data words in the row buffer can extend the life of a memory including the memory cells.

As also shown in FIG. 13, a plurality of sense enable (SEm) signals may be asserted upon issuance of a load command. As described with reference to FIG. 8, assertion of a SEm signal may lower the threshold voltage (Vt) of a sense circuit of a sense amplifier when loading a data word into a row buffer including the sense amplifier. Similarly, a bank select (BSm) signal may be asserted upon issuance of a read command. As described with reference to FIG. 8, assertion of a BSm signal may lower the threshold voltage (Vt) of a sense circuit of a sense amplifier when reading a data word from a row buffer including the sense amplifier.

As also shown in FIG. 13, a column selection signal (YS) may be asserted in combination with assertion of the BSm signal. Assertion of both the BSm and YS signals upon issuance of a read command may enable a data word to be read from a row buffer (i.e., a plurality of sense amplifiers), as described with reference to FIG. 7.

Figure 14:
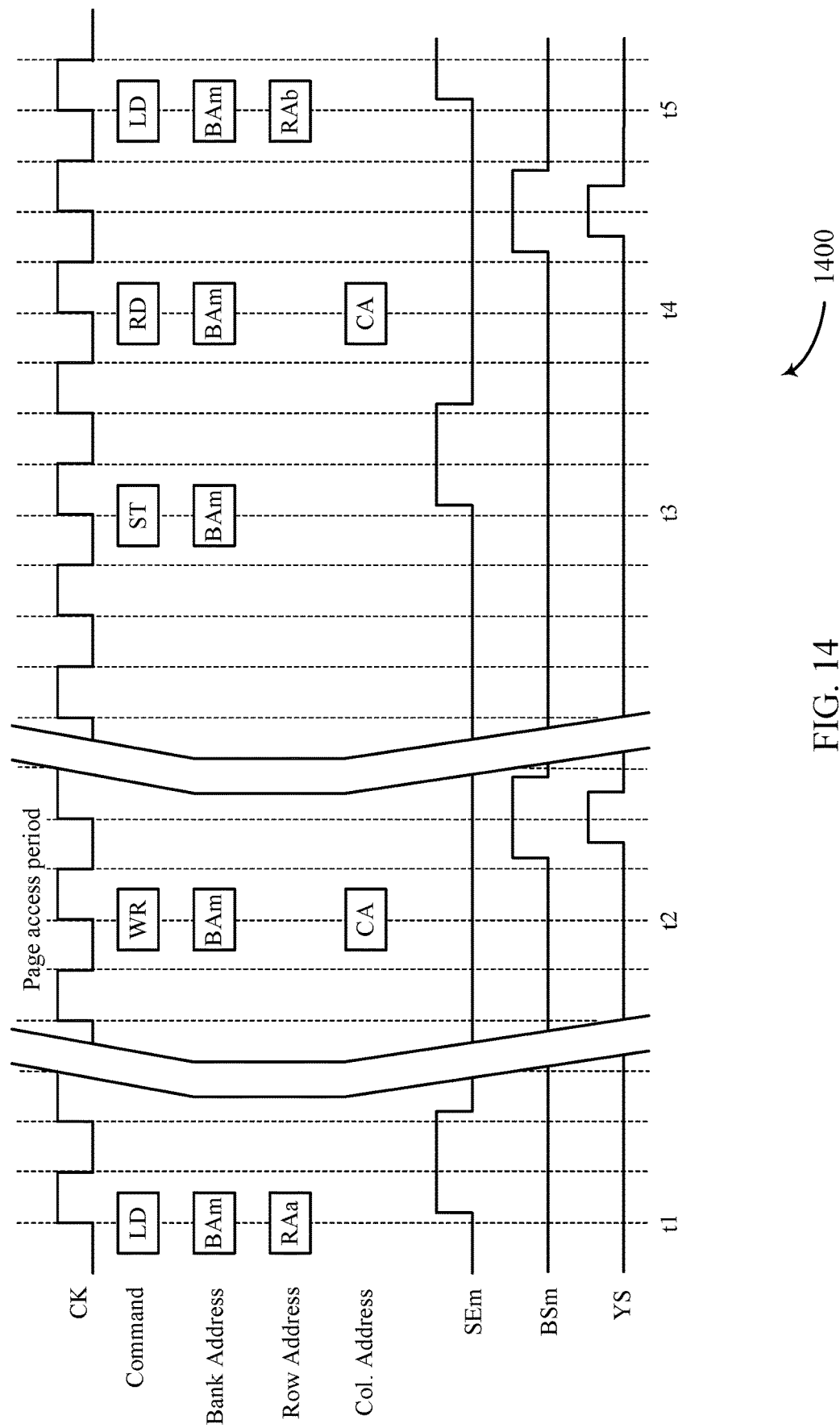
FIG. 14 illustrates an example sequence of operations in which a data word is loaded from a plurality of memory cells to a row buffer, or written to the row buffer, and then read from the row buffer instead of the memory cells, in accordance with various embodiments of the present disclosure.

FIG. 14 illustrates an example sequence of operations 1400 in which a data word is loaded from a plurality of memory cells to a row buffer, or written to the row buffer, and then read from the row buffer instead of the memory cells, in accordance with various embodiments of the present disclosure. By way of example, the memory cell may be one of the memory cell 505 or 605 described with reference to FIG. 5 or 6, and the sense amplifier may be one of the sense amplifiers described with reference to FIG. 5.

At time t1, a load command (LD) may be issued to load a first data word (stored in the plurality of memory cells) into the row buffer. The load command may be associated with a bank address (BAm) and assertion of a word line corresponding to a first row address (RAa). In some examples, the load command may executed as described with reference to FIG. 9 or 10. After the first data word is loaded into the row buffer, a number of read commands (not shown) may be issued to read the first data word from the row buffer.

At a time t2, a write command (WR) may be issued to write a second data word into the row buffer (e.g., from a memory controller). The write command may be associated with the bank address (BAm) and a column address (CA) of the row buffer). After the second data word is written into the row buffer, a number of read commands (not shown) may be issued to read the second data word from the row buffer. At a time t3, a store command (ST) may be issued to store the second data word in a plurality of memory cells. The store command may be associated with the bank address (BAm), but the row address (e.g., the row address RAa) is not needed because the corresponding word line is still asserted in this example. Following the store of the second data word in the plurality of memory cells, and in some examples, a read command (RD) associated with the bank address (BAm) and the column address (CA) of the row buffer may be issued (e.g., at a time t4 following the time t3). Any number of additional read commands may be issued following the time t2 or the time t3.

Upon issuing a read command that returns a "miss", a load command may be issued at time t5 to load a third data word into the row buffer. The third data word may be associated with the bank address (BAm) and a second row address (RAb). The third data word may be read from the row buffer any number of times following the time t5. During a read of the row buffer, the memory cells that store a corresponding data word are not disturbed. For memory cells that can only be read a limited number of times, the caching of data words in the row buffer can extend the life of a memory including the memory cells.

As also shown in FIG. 14, a plurality of sense enable (SEm) signals may be asserted upon issuance of a load command or a store command. As described with reference to FIG. 8, assertion of a SEm signal may lower the threshold voltage (Vt) of a sense circuit of a sense amplifier when loading a data word into a row buffer including the sense amplifier, or when storing a data word stored in the row buffer to a plurality of memory cells. Similarly, a bank select (BSm) signal may be asserted upon issuance of a read command or a write command. As described with reference to FIG. 8, assertion of a BSm signal may lower the threshold voltage (Vt) of a sense circuit of a sense amplifier when reading a data word from a row buffer including the sense amplifier, or when writing a data word received from a memory controller into the row buffer. At other times, the threshold voltages of the sense circuits associated with the sense amplifiers of a row buffer may be raised, to reduce the leakage current of the row buffer.

As also shown in FIG. 14, a column selection signal (YS) may be asserted in combination with assertion of the BSm signal. Assertion of both the BSm and YS signals upon issuance of a read command or a write command may enable a data word to be read from a row buffer (i.e., a plurality of sense amplifiers) or written to the row buffer, as described with reference to FIG. 7.

Figure 15:
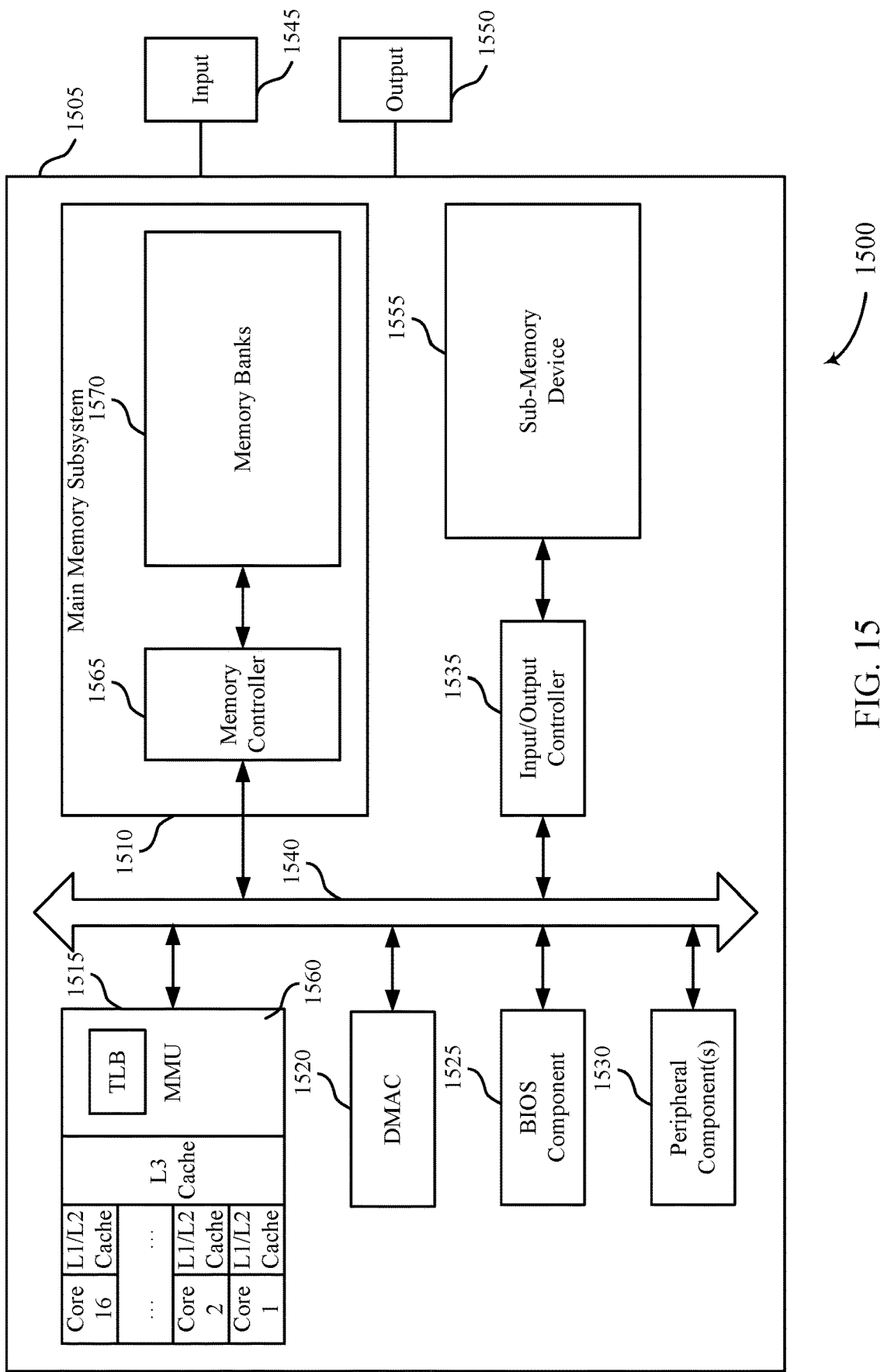
FIG. 15 shows a diagram of a system including a main memory subsystem, in accordance with various embodiments of the present disclosure.

FIG. 15 shows a diagram of a system 1500 including a main memory subsystem, in accordance with various embodiments of the present disclosure. The system 1500 may include a device 1505, which may be or include a printed circuit board to connect or physically support various components.

The device 1505 may include a main memory subsystem 1510, which may be an example of the memory device 100 described in FIG. 1. The main memory subsystem 1510 may contain a memory controller 1565 and a plurality of memory banks 1570. In some examples, the memory banks 1570 may be examples of the memory banks described with reference to FIG. 3 or 5, and each memory bank may be associated with a row buffer (including sense amplifiers) that is configured as described with reference to FIG. 3, 5, or 7.

The device 1505 may also include a processor 1515, a direct memory access controller (DMAC) 1520, a BIOS component 1525, peripheral component(s) 1530, and an input/output controller 1535. The components of the device 1505 may be in electronic communication with one another through a bus 1540. The processor 1515 may be configured to operate the main memory subsystem 1510 through the memory controller 1565. In some cases, the memory controller 1565 may be integrated into the processor 1515. The processor 1515 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these types of components. In some examples, the processor 1515 may be a multicore processor. The processor 1515 may perform various functions described herein. The processor 1515 may, for example, be configured to execute computer-readable instructions stored in the memory banks 1570 to cause the device 1505 to perform various functions or tasks.

The DMAC 1520 may enable the processor 1515 to perform direct memory accesses within the main memory subsystem 1510.

The BIOS component 1525 may be a software component that includes a basic input/output system (BIOS) operated as firmware, which may initialize and run various hardware components of the system 1500. The BIOS component 1525 may also manage data flow between the processor 1515 and various other components, e.g., the peripheral component(s) 1530, the input/output controller 1535, etc. The BIOS component 1525 may include a program or software stored in read-only memory (ROM), flash memory, or any other non-volatile memory.

The peripheral component(s) 1530 may be any input or output device, or an interface for such devices, that is integrated into the device 1505. Examples of peripheral devices may include disk controllers, sound controllers, graphics controllers, Ethernet controllers, modems, USB controllers, serial or parallel ports, or peripheral card slots, such as peripheral component interconnect (PCI) or accelerated graphics port (AGP) slots.

The input/output controller 1535 may manage data communication between the processor 1515 and the peripheral component(s) 1530, the input device(s) 1545, the output device(s) 1550, and/or the sub-memory device 1555 (e.g., a hard disk drive (HDD) and/or a solid state drive (SSD)). The input/output controller 1535 may also manage peripherals not integrated into the device 1505. In some cases, the input/output controller 1535 may represent a physical connection or port to an external peripheral.

The input device(s) 1545 may represent a device or signal external to the device 1505 that provides input to the device 1505 or its components. This may include a user interface or interface with or between other devices. In some cases, the input device(s) 1545 may include a peripheral that interfaces with the device 1505 via the peripheral component(s) 1530, or that can be managed by the input/output controller 1535.

The output device(s) 1550 may represent a device or signal external to the device 1505 that is configured to receive output from the device 1505 or any of its components. Examples of the output device(s) 1550 may include a display, audio speakers, a printing device, another processor or printed circuit board, etc. In some cases, output device(s) 1550 may include a peripheral that interfaces with the device 1505 via one of the peripheral component(s) 1530, or that can be managed by the input/output controller 1535.

The components of the device 1505, including the memory controller 1565 and the memory banks 1570, may include circuitry designed to carry out their functions. This may include various circuit elements, for example, conductive lines, transistors, capacitors, inductors, resistors, amplifiers, or other active or inactive elements, configured to carry out the functions described herein.

In some examples, an operating system (OS) executed by the processor 1515 may map processes (or cores) of the multicore processor to different groups of memory banks in a memory device (e.g., in the main memory subsystem 1510). Each memory bank may be associated with a row buffer, as described, for example, with reference to FIG. 3, 5, or 7. The mapping of processes (or cores) to groups of memory banks may be used to maintain spatial locality of data within row buffers, thereby increasing the likelihood of a hit when a data word is retrieved from a plurality of memory cells. When the hit rate is improved, the number of accesses of the memory cells may be reduced, which in some cases may shorten read latency and/or extend the life of the memory cells. In some examples, a mapping of processes (or cores) to groups of memory banks may be changed in accordance with changes in working set sizes of the processes (or cores). In some examples, continuous pages inside a working set may be developed in row buffers of different memory banks within a group of memory banks.

In some examples, the processor 1515 may have 16 cores and the main memory subsystem 1510 may be partitioned into 512 memory banks. In these examples, the memory banks may be allocated to the cores equally (e.g., each core may be mapped to a different group of 32 memory banks (e.g., Core 1 may be mapped to memory banks 1 to 32; Core 2 may be mapped to memory banks 33 to 64; . . . Core 16 may be mapped to memory banks 481 to 512)) or unequally (e.g., different cores may be mapped to different numbers of memory banks).

In some examples, the processor 1515 may issue at least one of a read command or a write command. Upon issuance of a read command, the memory controller 1565 may identify a memory address (e.g., a bank address and a row address) associated with the read command and attempt to read a data word from a row buffer associated with a memory bank. When there is a hit in the row buffer, the memory controller 1565 may provide the data word stored in the row buffer to the processor 1515, as described, for example, with reference to FIG. 9, 10, or 13. When there is a miss in the row buffer, the memory controller 1565 may cause the data word to be read from a plurality of memory cells in the memory bank and stored in the row buffer as the data word is provided to the processor 1515, as described, for example, with reference to FIG. 9 or 10. Upon issuance of a write command, the memory controller 1565 may identify a memory address (e.g., a bank address and a row address) associated with the write command and write a data word to a row buffer associated with a memory bank, as described, for example, with reference to FIG. 11 or 12. The data word stored in the row buffer may then be stored in a plurality of memory cells of the memory bank, as described, for example, with reference to FIG. 11, 12, or 14.

Figure 16:
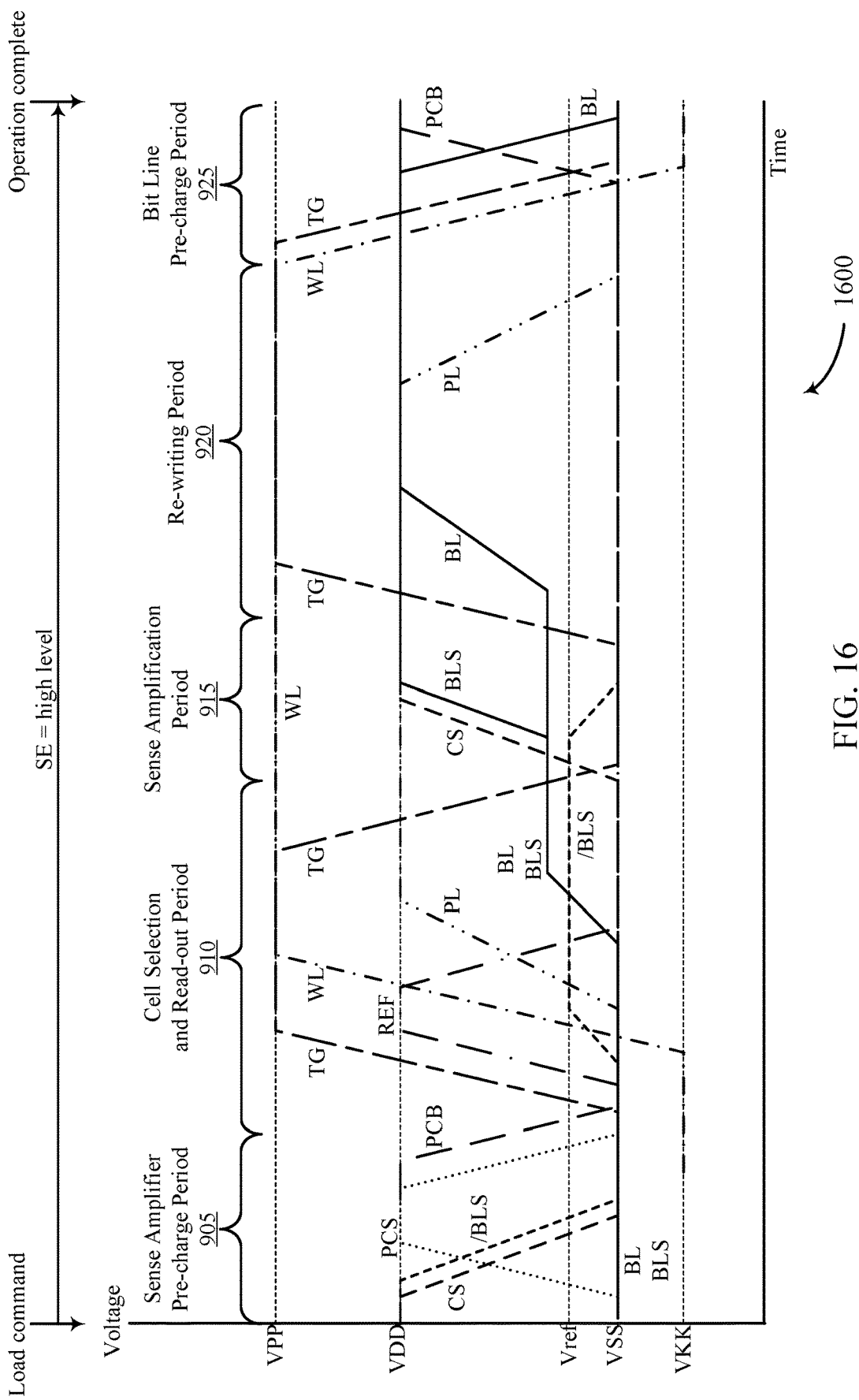
FIG. 16 illustrates example waveforms that may be applied to various terminals, or which may appear on various nodes, upon issuing a load command and loading a logic one or high-level logic value from a memory cell to a sense amplifier, in accordance with various embodiments of the present disclosure.
Figure 17:
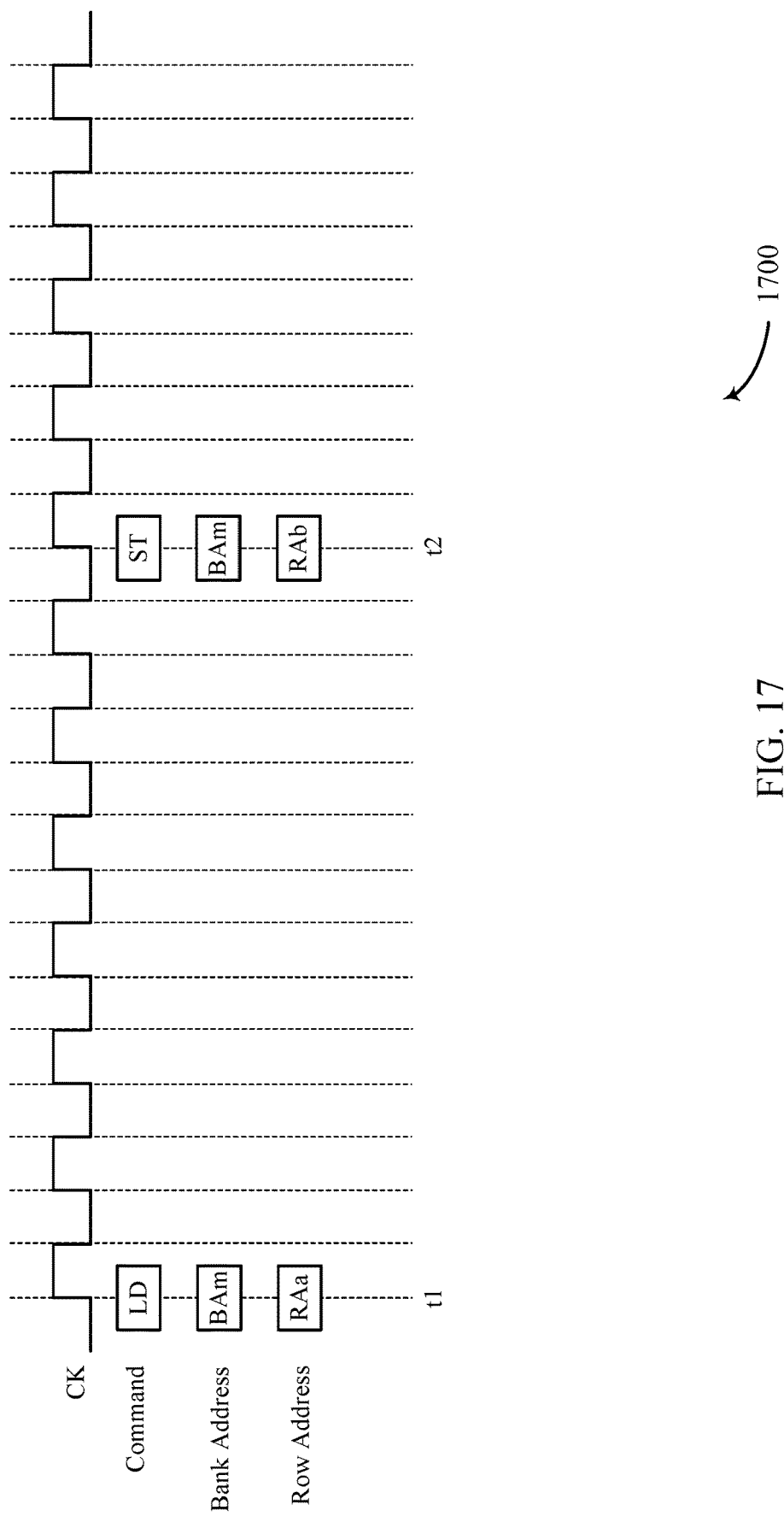
FIG. 17 illustrates an example sequence of operations in which a data word is loaded from a first plurality of memory cells to a row buffer, and then stored in a second plurality of memory cells, in accordance with various embodiments of the present disclosure.

FIGS. 16 and 17 show how techniques described in the present disclosure may be used to perform a wear leveling operation in which, for example, data read from a first plurality of memory cells associated with a first row address may be stored in a second plurality of memory cells associated with a second row address, without a need to read the data from a memory device (e.g., without a need for memory I/O activity). In some examples, a wear leveling operation may be performed by counting the number of loading and storing processes performed for each memory bank (or sub-bank) of a memory device, and upon performance of a predetermined number of loading and/or storing processes within a memory bank (or sub-bank), a wear leveling operation may be performed within the memory bank (or sub-bank). In some examples, the memory cells to which a data word is stored during a wear leveling operation may be identified as a plurality of memory cells associated with a data gap (e.g., no data word, or a data word that is no longer useful).

FIG. 16 illustrates example waveforms 1600 that may be applied to various terminals, or which may appear on various nodes, upon issuing a load command and loading a logic one or high-level logic value from a memory cell to a sense amplifier, in accordance with various embodiments of the present disclosure. By way of example, the sense amplifier is assumed to store a low-level logic value prior to the load of the high-level logic value. By way of further example, the memory cell may be one of the memory cell 505 or 600 described with reference to FIG. 5 or 6, and the sense amplifier may be one of the sense amplifiers described with reference to FIG. 5.

The waveforms 1600 are similar to the waveforms 900 described with reference to FIG. 9, but for the word line (WL) and previously asserted word line (WL') waveforms. More particularly, there is no previously asserted word line (WL') waveform in the waveforms 1600, and the word line (WL) waveform is transitioned to a low level (VKK) at the beginning of the bit line pre-charge period 925, just prior to (or substantially in parallel with) opening the isolation gate. In this manner, a memory bank (or sub-bank) may be prepared to receive a new row address associated with a different word line, following pre-charge of the bit line (BL) to the low level (VSS), so that the logic value stored in the sense amplifier during the cell selection may be stored to a memory cell that differs from the memory cell from which the logic value was read (e.g., so that a wear leveling operation may be performed).

FIG. 17 illustrates an example sequence of operations 1700 in which a data word is loaded from a first plurality of memory cells to a row buffer, and then stored in a second plurality of memory cells, in accordance with various embodiments of the present disclosure. By way of example, the memory cell may be one of the memory cell 505 or 600 described with reference to FIG. 5 or 6, and the sense amplifier may be one of the sense amplifiers described with reference to FIG. 5.

At time t1, a load command (LD) may be issued to load a data word (stored in the first plurality of memory cells) into the row buffer. The load command may be associated with assertion of a bank address (BAm) and a word line corresponding to a first row address (RAa). In some examples, the load command may be executed as described with reference to FIG. 9 or 10. After the data word is loaded into the row buffer, a first number of read commands (not shown) may or may not be issued to read the data word from the row buffer.

At a time t2, a store command (ST) may be issued to store the data word (which is stored in the row buffer) in the second plurality of memory cells. The store command may be associated with the bank address (BAm) and assertion of a word line corresponding to a second row address (RAb). After the data word is stored in the second plurality of memory cells, a second number of read commands (not shown) may or may not be issued to read the data word from the row buffer.

Figure 18:
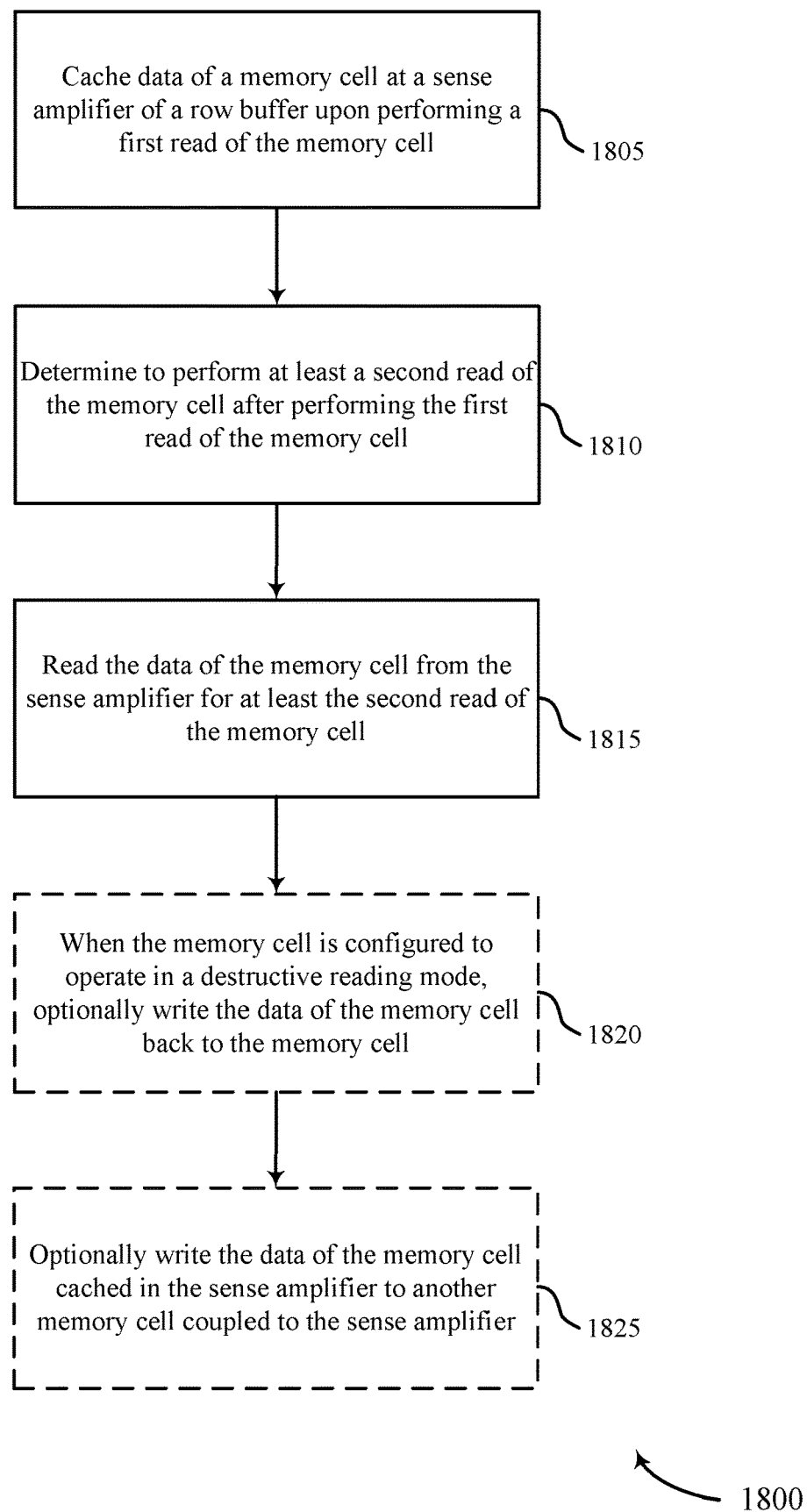
FIG. 18 shows a flowchart illustrating a method of operating a memory device or system, in accordance with various embodiments of the present disclosure.

FIG. 18 shows a flowchart illustrating a method 1800 of operating a memory device or system, in accordance with various embodiments of the present disclosure. The operations of the method 1800 may be performed on or within a memory device or system, such as the memory device 100 or system 1500 described with reference to FIG. 1 or 15, or on or within a memory device or system including the memory banks or memory cells described with reference to FIG. 3, 4, 5, 6, 15, or 18. In some examples, the operations of the method 1800 may be performed by or under the control of a memory controller and/or memory device, such as the memory controller 1565 and/or memory device 100 described with reference to FIG. 1 or 15. In some examples, a memory controller and/or memory device may execute a set of codes to control the functional elements of a memory bank to perform the functions described below. Additionally or alternatively, the memory controller and/or memory device may perform aspects of the functions described below using special-purpose hardware.

At block 1805, the method may include caching data of a memory cell at a sense amplifier of a row buffer upon performing a first read of the memory cell, as described, for example, with reference to FIG. 9 or 10. In some examples, the memory cell may include a ferroelectric memory cell. In some examples, the ferroelectric memory cell may be configured to operate in a destructive reading mode.

At block 1810, the method may include determining to perform at least a second read of the memory cell after performing the first read of the memory cell, as described, for example, with reference to FIG. 13. The second read of the memory cell may include a next read of the memory cell following the first read of the memory cell.

At block 1815, the method may include reading the data of the memory cell from the sense amplifier for at least the second read of the memory cell, as described, for example, with reference to FIG. 13.

At block 1820, and when the memory cell is configured to operate in a destructive reading mode, the method may optionally include writing the data of the memory cell back to the memory cell after caching the data of the memory cell at the sense amplifier, as described, for example, with reference to FIG. 9 or 10.

At block 1825, the method may optionally include writing the data of the memory cell cached in the sense amplifier to another memory cell coupled to the sense amplifier (e.g., performing a wear leveling operation), as described, for example, with reference to FIG. 16 or 17.

In some examples, the method 1800 may include closing an isolation gate, prior to caching the data of the memory cell at the sense amplifier, to couple a bit line to which the memory cell is coupled to the sense amplifier. The method may also include opening the isolation gate after caching the data of the memory cell at the sense amplifier, to decouple the bit line from the sense amplifier. When the method includes the re-writing operation(s) at block 1820, the method may include opening the isolation gate after writing the data of the memory cell back to the memory cell. In some examples in which the re-writing operation(s) at block 1820 are performed, the method may include opening the isolation gate while amplifying the data of the memory cell at the sense amplifier, closing the isolation gate prior to writing the data of the memory cell back to the memory cell, and re-opening the isolation gate after writing the data of the memory cell back to the memory cell. In some examples, the method may include pre-charging the bit line to a same voltage as a cell plate of the memory cell. When the method does not include the re-writing operation(s) at block 1820, the pre-charging may be performed after opening the isolation gate following caching of the data of the memory cell at the sense amplifier. When the method does include the re-writing operation(s) at block 1820, the pre-charging may be performed after opening the isolation gate following the re-writing operation(s). In some examples, the data of the memory cell may be read from the sense amplifier, for at least the second read of the memory cell, while the isolation gate is open (i.e., while the bit line is decoupled from the sense amplifier).

Figure 19:
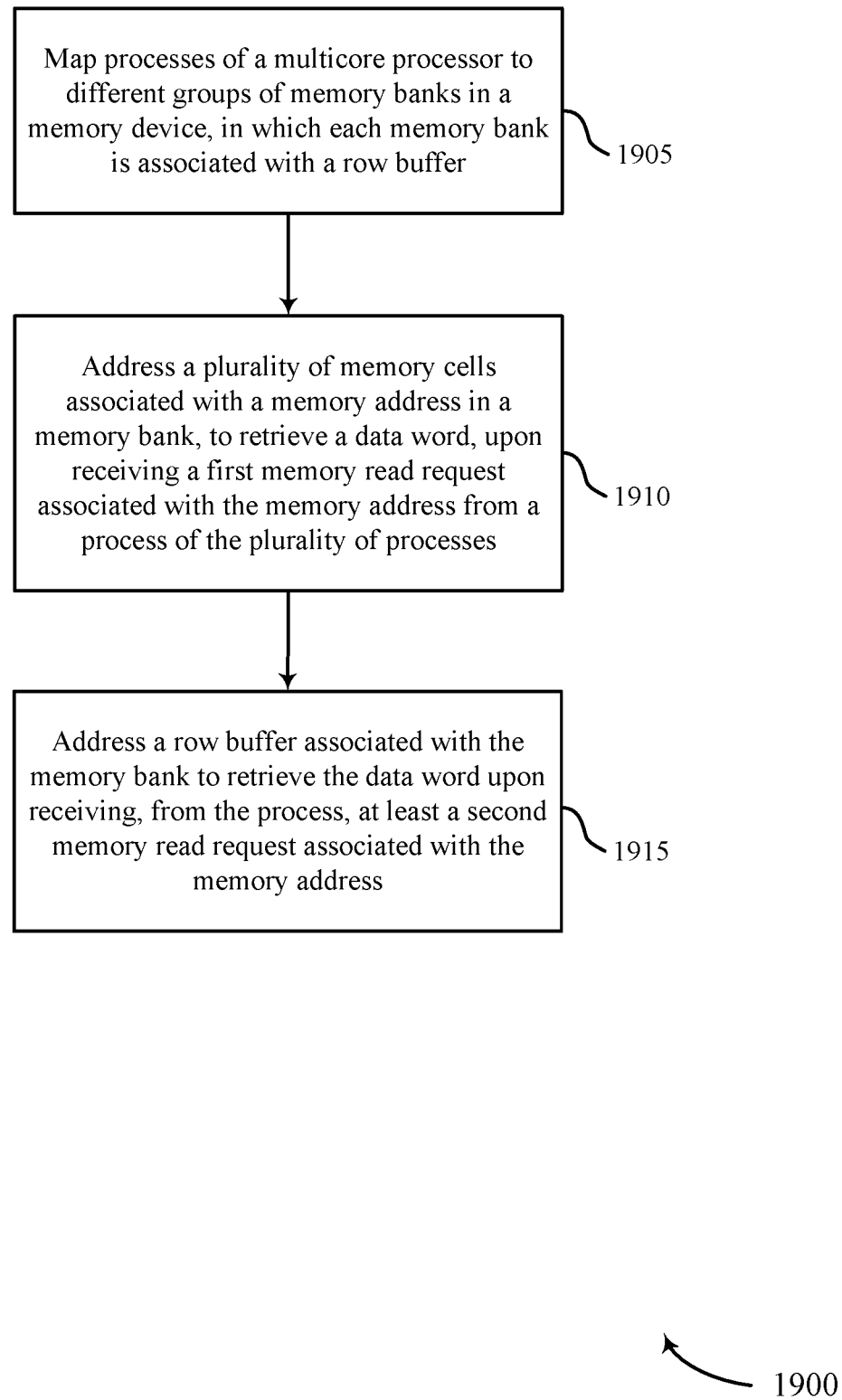
FIG. 19 shows a flowchart illustrating a method of operating a memory device or system, in accordance with various embodiments of the present disclosure.

FIG. 19 shows a flowchart illustrating a method 1900 of operating a memory device or system, in accordance with various embodiments of the present disclosure. The operations of the method 1900 may be performed on or within a memory device or system, such as the memory device 100 or system 1500 described with reference to FIG. 1 or 15, or on or within a memory device or system including the memory banks or memory cells described with reference to FIG. 3, 4, 5, 6, 15, or 18. In some examples, the operations of the method 1900 may be performed by or under the control of a processor, memory controller, and/or memory device, such as the processor 1515, memory controller 1565, and/or memory device 100 described with reference to FIG. 1 or 15. In some examples, a processor, memory controller, and/or memory device may execute a set of codes to control the functional elements of a memory bank to perform the functions described below. Additionally or alternatively, the processor, memory controller, and/or memory device may perform aspects of the functions described below using special-purpose hardware.

At block 1905, the method may include mapping processes of a multicore processor to different groups of memory banks in a memory device, as described, for example, with reference to FIG. 15. Each memory bank may be associated with a row buffer. In some examples, the processes of the multicore processor may be mapped to the different groups of memory banks based at least in part on mapping cores of the multicore processor to the different groups of memory banks.

At block 1910, the method may include addressing a plurality of memory cells associated with a memory address in a memory bank, to retrieve a data word, upon receiving a first memory read request associated with the memory address from a process of the plurality of processes.

At block 1915, the method may include addressing a row buffer associated with the memory bank to retrieve the data word upon receiving, from the process, at least a second memory read request associated with the memory address. The second memory read request may include a next read request of the memory cell after the first memory read request.

It should be noted that methods 1800 and 1900 describes possible implementations, and the operations and steps of the methods 1800 and 1900 may be rearranged or otherwise modified such that other implementations are possible. In some examples, aspects of the methods 1800 and 1900 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including the memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An apparatus comprising:
a first memory sub-bank and a second memory sub-bank, the first memory sub-bank and the second memory sub-bank each comprising a plurality of memory cells;
a first row buffer coupled with the first memory sub-bank and comprising a plurality of sense components configured to cache data associated with the first memory sub-bank;
a second row buffer coupled with the second memory sub-bank and comprising a second plurality of sense components configured to cache data associated with the second memory sub-bank; and
a bank control circuit comprising a plurality of latches and configured to cache the data associated with the first memory sub-bank in the first row buffer and cache the data associated with the second memory sub-bank in the second row buffer, wherein a latch of the plurality of latches is configured to store at least a portion of an address of the memory cells associated with the first memory sub-bank based at least in part on caching the data of the first memory sub-bank.

2. The apparatus of claim 1, further comprising:
a column decoder coupled with the first memory sub-bank and the second memory sub-bank, the column decoder configured to receive from the bank control circuit a column address of at least one memory cell of the first memory sub-bank or the second memory sub-bank, wherein the bank control circuit is configured to cache the data in the first row buffer or in the second row buffer based at least in part on the column decoder receiving the column address.

3. The apparatus of claim 1, wherein the data cached in the first row buffer or the second row buffer is written to at least one memory cell of the first memory sub-bank or the second memory sub-bank.

4. The apparatus of claim 1, wherein the data cached in the first row buffer or the second row buffer is read from at least one memory cell of the first memory sub-bank or the second memory sub-bank.

5. The apparatus of claim 1, wherein the plurality of sense components are configured to amplify the data associated with the plurality of memory cells of the first memory sub-bank and the second memory sub-bank before caching the data.

6. The apparatus of claim 1, further comprising:
a plurality of bit lines coupled with the first memory sub-bank and the second memory sub-bank; and
a plurality of isolation gates coupled with the plurality of bit lines, wherein the bank control circuit is configured to cache the data associated with the first memory sub-bank or the second memory sub-bank when the plurality of isolation gates are closed, wherein the plurality of isolation gates are closed based at least in part on a bit line of the plurality of bit lines being decoupled from the first row buffer, the second row buffer, or a combination thereof.

7. The apparatus of claim 6, wherein the plurality of bit lines are decoupled from the first memory sub-bank and the second memory sub-bank when the plurality of isolation gates are opened.

8. The apparatus of claim 6, wherein the bank control circuit is configured to precharge the bit line of the plurality of bit lines associated with the at least one memory cell of the first memory sub-bank or the second memory sub-bank before reading the data.

9. The apparatus of claim 1, wherein the bank control circuit is configured to transmit a bank select (BS) signal, a plate voltage (PL) signal, an isolation gate control signal (TG), a bit line pre-charge signal (PCB), a sense amplifier pre-charge signal (PCS), a reference voltage application signal (REF), or a sense circuit activation signal (CS) to the first memory sub-bank and to the second memory sub-bank, or a combination thereof.

10. The apparatus of claim 1, wherein the plurality of memory cells of the first memory sub-bank and the plurality of memory cells of the second memory sub-bank each comprise a plurality of ferroelectric memory cells.

11. A method, comprising:
caching, at a sense component of a first row buffer, data associated with a first memory sub-bank during a first access operation, the first memory sub-bank coupled with a bank control circuit that is configured to cache the data associated with the first memory sub-bank in the first row buffer, wherein at least a portion of an address associated with the first access operation of the first memory sub-bank is latched in the bank control circuit based at least in part on caching the data of the first memory sub-bank;

caching, at a sense component of a second row buffer, data associated with a second memory sub-bank during the first access operation, the second memory sub-bank coupled with the bank control circuit that is configured to cache the data associated with the first memory sub-bank in the first row buffer; and accessing, from the first row buffer or the second row buffer, the cached data associated with the first memory sub-bank or the second memory sub-bank during a second access operation.

12. The method of claim 11, further comprising:
transmitting a row address to a row decoder coupled with the first memory sub-bank or the second memory sub-bank; and
transmitting a column address to a column decoder coupled with the first memory sub-bank and the second memory sub-bank, wherein caching the data at the sense component of the first row buffer or caching the data at the sense component of the second row buffer is based at least in part on providing the row address to the row decoder and providing the column address to the column decoder.

13. The method of claim 11, further comprising:
amplifying, at the sense component of the first row buffer, the data associated with the first memory sub-bank before caching the data.

14. The method of claim 11, further comprising:
writing the cached data to the first memory sub-bank or the second memory sub-bank before reading the cached data during the second access operation.

15. The method of claim 11, wherein caching the data associated with the first memory sub-bank comprises closing at least one isolation gate coupled with a bit line associated with the first memory sub-bank by decoupling the bit line from the sense component of the first row buffer.

16. The method of claim 15, further comprising:
precharging the bit line associated with the first memory sub-bank before caching the data associated with the first memory sub-bank.

17. An apparatus, comprising:
a first memory sub-bank comprising a plurality of memory cells;
a second memory sub-bank comprising a plurality of memory cells;
a first row buffer coupled with the first memory sub-bank;
a second row buffer coupled with the second memory sub-bank; and
a bank control circuit comprising a plurality of latches and in communication with the first memory sub-bank and the second memory sub-bank, wherein the bank control circuit is operable to:
cache data associated with the first memory sub-bank in the first row buffer during a first access operation
cache data associated with the second memory sub-bank in the second row buffer during the first access operation;
latch at least a portion of an address of the memory cells associated with the first memory sub-bank and the second memory sub-bank based at least in part on caching the data of the first memory sub-bank; and
access the cached data in the first row buffer or the cached data in the second row buffer during a second access operation.

18. The apparatus of claim 17, wherein the second access operation comprises a write operation of the first memory sub-bank.

19. The apparatus of claim 17, wherein the second access operation comprises a read operation of the first memory sub-bank.

20. The apparatus of claim 17, wherein the plurality of memory cells of the first memory sub-bank and the plurality of memory cells of the second memory sub-bank each comprise ferroelectric memory cells.

* * * * *